United States Patent
Kim et al.

(10) Patent No.: US 9,792,206 B2
(45) Date of Patent: Oct. 17, 2017

(54) MEMORY CONTROLLER AND MEMORY SYSTEM INCLUDING THE SAME

(71) Applicants: Moosung Kim, Yongin-si (KR); Dawoon Jung, Hwaseong-si (KR)

(72) Inventors: Moosung Kim, Yongin-si (KR); Dawoon Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 597 days.

(21) Appl. No.: 14/179,661

(22) Filed: Feb. 13, 2014

(65) Prior Publication Data

US 2014/0258597 A1    Sep. 11, 2014

(30) Foreign Application Priority Data

Mar. 7, 2013   (KR) ................. 10-2013-0024628

(51) Int. Cl.
  *G06F 3/00* (2006.01)
  *G06F 12/02* (2006.01)
  *G11C 16/26* (2006.01)
  *G11C 11/56* (2006.01)

(52) U.S. Cl.
  CPC ...... *G06F 12/0246* (2013.01); *G11C 11/5642* (2013.01); *G11C 16/26* (2013.01)

(58) Field of Classification Search
  None
  See application file for complete search history.

(56) References Cited

U.S. PATENT DOCUMENTS

| | | | |
|---|---|---|---|
| 7,058,850 B2* | 6/2006 | Cochran | G06F 11/1443 714/4.4 |
| 7,301,817 B2 | 11/2007 | Li et al. | |
| 7,315,471 B2 | 1/2008 | Shibata et al. | |
| 7,525,850 B2 | 4/2009 | Chae et al. | |
| 7,529,130 B2 | 5/2009 | Toda | |
| 7,532,495 B2 | 5/2009 | Youn et al. | |
| 7,636,261 B2 | 12/2009 | Shibata | |
| 7,672,162 B2* | 3/2010 | Hwang | G11C 16/3418 365/185.03 |
| 8,054,685 B2 | 11/2011 | Lim | |
| 8,263,623 B2 | 9/2012 | Jones et al. | |
| 2004/0221173 A1* | 11/2004 | Moyer | G06F 13/4013 713/189 |
| 2009/0225593 A1* | 9/2009 | Cha | G11C 11/5642 365/185.03 |
| 2010/0062715 A1 | 3/2010 | Kim et al. | |
| 2010/0124107 A1* | 5/2010 | Yoon | G11C 8/10 365/185.2 |
| 2010/0149869 A1* | 6/2010 | Kim | G11C 16/26 365/185.03 |
| 2010/0309237 A1 | 12/2010 | Roh | |

(Continued)

*Primary Examiner* — Elias Mamo
(74) *Attorney, Agent, or Firm* — Volentine & Whitt, PLLC

(57) ABSTRACT

An operating method is for a memory device which controls a nonvolatile memory. The operating method includes managing a program depth bit map indicating an upper page program state of each of a plurality of word lines of the nonvolatile memory in response to an external write request, and outputting one of a plurality of different read commands to the nonvolatile memory based on information of the program depth bit map corresponding to a word line to be accessed in response to an external read request.

14 Claims, 27 Drawing Sheets

(56) References Cited

U.S. PATENT DOCUMENTS

| | | |
|---|---|---|
| 2010/0315325 A1 | 12/2010 | Hwang |
| 2012/0008397 A1* | 1/2012 | Shin .................. G11C 11/5628 365/185.11 |
| 2012/0170379 A1 | 7/2012 | Ahn |
| 2013/0232291 A1* | 9/2013 | Patapoutian ........ G06F 12/0246 711/103 |

* cited by examiner

MEMORY CONTROLLER AND MEMORY SYSTEM INCLUDING THE SAME

CROSS-REFERENCE TO RELATED APPLICATIONS

A claim for priority under 35 U.S.C. §119 is made to Korean Patent Application No. 10-2013-0024628 filed Mar. 7, 2013, in the Korean Intellectual Property Office, the entire contents of which are hereby incorporated by reference.

BACKGROUND

The inventive concepts described herein relate to memory controllers and memory systems which control and/or include a nonvolatile memory device which stores multi-bit data.

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, the data are stored and can be read out as long as the power is applied, and are lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of retaining stored data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of being electrically erased and written. Application of the EEPROM (i.e., flash EEPROM) has expanded to auxiliary memory and system programming where continuous updates are needed.

SUMMARY

One aspect of embodiments of the inventive concept is directed to provide an operating method of a memory device which controls a nonvolatile memory. The operating method includes managing a program depth bit map indicating an upper page program state of each of a plurality of word lines of the nonvolatile memory in response to an external write request, and outputting one of a plurality of different read commands to the nonvolatile memory based on information of the program depth bit map corresponding to a word line to be accessed in response to an external read request.

The plurality of different read commands may include a first read command directing a read operation on a word line only having a lower page program state, and a second read command directing a read operation on a word line having an upper page program state.

A read time corresponding to a lower page read operation of the nonvolatile memory executed according to the first read command may be the same as a read time corresponding to a lower page read operation of the nonvolatile memory executed according to the second read command.

A read operation of the nonvolatile memory executed according to each of the first and second read commands may not include an operation of determining an upper page program state of the word line to be accessed.

At least 2-page data may be stored at memory cells of each word line.

Another aspect of embodiments of the inventive concept is directed to provide a memory system which includes at least one nonvolatile memory, and a memory controller configured to control the at least one nonvolatile memory. The memory controller is responsive to an external read request to provide the at least one nonvolatile memory with one of a plurality of different read commands based on bit information, corresponding to a word line to be accessed, of a program depth bit map indicating an upper page program state of each of a plurality of word lines of the at least one nonvolatile memory.

The memory controller may be responsive to an external write request to manage the program depth bit map in accordance with the external write request.

The plurality of read commands may include a first read command directing a read operation on a word line only having a lower page program state, and a second read command directing a read operation on a word line having an upper page program state.

When the first read command is received, the at least one nonvolatile memory may perform a read operation on lower page data of the word line to be accessed. When the second read command is received, the at least one nonvolatile memory may perform a read operation on one of lower page data and upper page data of the word line to be accessed based on a page address input together with the second read command. A read time corresponding to lower page data of the nonvolatile memory executed according to the first read command may be the same as a read time corresponding to lower page data of the nonvolatile memory executed according to the second read command.

The at least one nonvolatile memory does not include flag cells for storing program states of the word lines. Alternatively, the at least one nonvolatile memory may include flag cells for storing program states of the word lines, where the flag cells are accessed to form the program depth bit map before the at least one nonvolatile memory is provided with the one of the plurality of different read commands.

The at least one nonvolatile memory may include memory cells each storing low page data and upper page data.

A read operation of the nonvolatile memory executed according to each of the first and second read commands may not include an operation of determining an upper page program state of the word line to be accessed.

Still another aspect of embodiments of the inventive concept is directed to provide a memory controller which includes a host interface configured to interface with a host device, a memory interface configured to interface with a nonvolatile memory which includes a plurality of word lines, a processor configured to transmit commands to the memory interface in accordance with requests received from the host interface, and a memory configured to store an upper bit program state of each of the plurality of word lines of the nonvolatile memory. The processor is responsive to a read request received via the host interface to access the memory to determine the upper bit program state of a word line to be accessed among the plurality of word lines, and to transmit one of plural different read commands to the memory interface in accordance with the determined upper bit program state of the word line to be accessed.

The upper bit program state of each of the plurality of word lines may be stored as a bit map in the memory, and the processor may be configured to update the bit map in response to a write request received via the host interface.

Yet another aspect of embodiments of the inventive concept is directed to provide a read method of a nonvolatile memory device which includes determining whether an input read command is a read command for a word line having an upper page program state. When the input read command is determined not to be a read command for a word line having an upper page program state, a first lower page read operation is performed on the word line. When the input read command is determined to be a read command for a word line having an upper page program state, it is determined whether a page address input together with the input read command is a lower page address. When the page address input together with the input read command is determined to be the lower page address, a second lower page read operation is performed on the word line. When the page address input together with the input read command is determined not to be the lower page address, an upper page read operation is performed on the word line.

A read time taken to perform the first lower page read operation may be the same as a read time taken to perform the second lower page read operation.

Each of the first lower page read operation, the second lower page read operation, and the upper page read operation may not include an operation of determining an upper page program state of the word line.

The nonvolatile memory device may include a flag cell for storing a program state of the word line, and the flag cell may not be accessed in response to the input read command.

An upper page of the upper page read operation may include an intermediate page and an uppermost page, and the performing of the upper page read operation on the word line may include determining whether the input page address is an intermediate page address. When the input page address is determined to be the intermediate page address, an intermediate page read operation may be performed on the word line. When the input page address is determined not to be the intermediate page address, an uppermost page read operation may be performed on the word line. Each of the intermediate page read operation and the uppermost page read operation may not include an operation of determining an upper page program state of the word line.

An upper page of the upper page read operation may include a first intermediate page, a second intermediate page and an uppermost page, and the performing of the upper page read operation on the word line may include determining whether the input page address is a first intermediate page address. When the input page address is determined to be the first intermediate page address, a first intermediate page read operation may be performed on the word line. When the input page address is determined not to be the first intermediate page address, a determined is made as to whether the input page address is a second intermediate page address. When the input page address is determined to be the second intermediate page address, a second intermediate page read operation may be performed on the word line. When the input page address is determined not to be the second intermediate page address, an uppermost page read operation may be performed on the word line. Each of the first intermediate page read operation, the second intermediate page read operation, and the uppermost page read operation may not include an operation of determining an upper page program state of the word line.

Another aspect of embodiments of the inventive concept is directed to provide a nonvolatile memory device which includes a memory cell array including memory cells arranged in rows and columns, a read/write circuit configured to read data from the memory cell array and to store data at the memory cell array, and control logic configured to control the read/write circuit in response to a read command provided from an external device. The control logic determines whether the read command is a first read command directing a read operation on a word line having a lower page program state or a second read command directing a read operation on a word line having an upper page program state. When the read command is determined to be the second read command, the control logic controls the read/write circuit to read a lower page or an upper page of a word line based on a page address input with the second read command.

Each of read operations corresponding to the first and second read commands may not include an operation of determining an upper program state of a word line.

The memory cell array may further include a flag cell for storing a program state of the word line, and the flag cell may not be accessed in response to the read command.

A read time of a lower page read operation executed according to the first read command may be the same as a read time of a lower page read operation executed according to the second read command.

BRIEF DESCRIPTION OF THE FIGURES

The above and other aspects and features will become apparent from the detailed description that follows with reference to the accompanying figures, wherein like reference numerals refer to like parts throughout the various figures unless otherwise specified, and wherein.

DETAILED DESCRIPTION

Figure 1A:
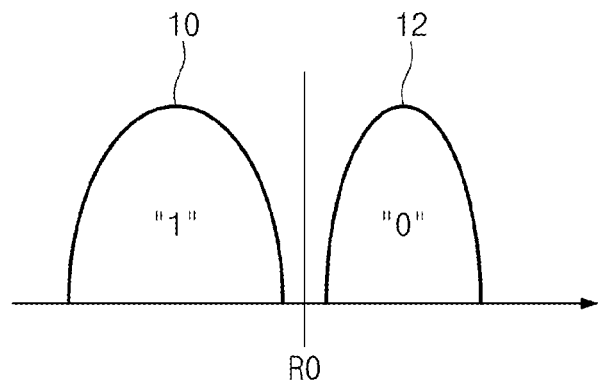
FIGS. 1A and 1B are diagrams schematically illustrating an example of threshold voltage distributions of a nonvolatile memory cell during a 2-bit storage operation.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used hereinterpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1B:
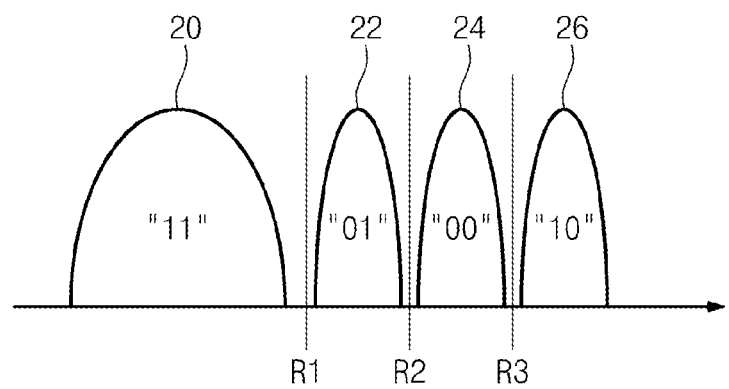

FIGS. 1A and 1B are diagrams schematically illustrating threshold voltage distributions of nonvolatile memory cells during an operation in which 2-bit data is stored. In FIG. 1A, there are illustrated threshold voltage distributions formed when memory cells are programmed with lower data (e.g., least significant bit (LSB) data). In FIG. 1B, there are illustrated threshold voltage distributions formed when the LSB-programmed memory cells are programmed with upper data (e.g., most significant bit (MSB) data).

Referring to FIG. 1A, when programmed with LSB data, a memory cell may have an erase state 10 or a program state 12. The LSB data may be determined on the basis of a read voltage R0. For example, the LSB data (1 or 0) of the memory cell may be discriminated by the amount of current flowing through the memory cell to which the read voltage R0 is applied.

Referring to FIG. 1B, when an LSB-programmed memory cell having the erase state 10 or the program state 12 is MSB-programmed, it may have one of an erase state 20 and program states 22, 24, and 26. The states 20 to 26 may correspond to 2-bit data. For example, the 20, 22, 24 and 26 may be designated as two-bit data "11", "01", "00", and "10", respectively. With such bit ordering, LSB data may be determined on the basis of a read voltage R2, and MSB data may be determined on the basis of read voltages R1 and R3. However, it is well understood that the bit designations of each state are not limited to the example shown in FIG. 1B.

In the example of FIG. 1B, LSB data of a memory cell may be decided by a value read on the basis of a bit line voltage which is decided according to the amount of current flowing through the memory cell to which the read voltage R2 is applied. MSB data may be decided by a combination of a first value read on the basis of a bit line voltage which is decided according to the amount of current flowing through the memory cell to which the read voltage R1 is applied, and a second value read on the basis of a bit line voltage which is decided according to the amount of current flowing through the memory cell to which the read voltage R3 is applied.

A read sequence may vary according to whether a word line selected according to an external read request is at an LSB program state or an MSB program state. In other words, a read voltage may be changed according to whether the selected word line is at an LSB program state or an MSB program state. Whether the selected word line is at an LSB program state or an MSB program state, for example, may be determined by referring to a state of a flag cell. For example, the flag cell may be programmed to have one of the program states 24 and 26 when MSB data is programmed at the memory cell.

At a read operation of LSB page data, a state of the flag cell may be read together when LSB page data is read from memory cells of a word line selected according to a read request using the read voltage R2. When data read from the flag cell indicates that the selected word line is at an LSB program state, LSB page data corresponding to the read request may be again read from the memory cells of the selected word line using the read voltage R0. Data read using the read voltage R0 may be LSB page data corresponding to the read request. When data read from the flag cell indicates that the selected word line is at an MSB program state, data read using the read voltage R2 may be LSB page data corresponding to the read request.

At a read operation of MSB page data, a state of the flag cell may be read together when memory cells of a word line selected according to a read request are read using the read voltage R2. When data read from the flag cell indicates that the selected word line is at an MSB program state, the memory cells of the selected word line may be again read using the read voltage R3. A combination of data read using the read voltages R1 and R3 may be MSB page data corresponding to the read request. When data read from the flag cell indicates that the selected word line is at an LSB program state, data read using the read voltage R1 may be MSB page data corresponding to the read request.

The use of a flag cell as described above requires the read time associated with reading a state of the flag cell. That is, for example to determined LSB data, two read operations may be needed, i.e., a first read operation at read voltage R2 to determine that a selected word line is at an LSB program state, and a second read operation at R0 to read the LSB data. In a read sequence is determined using a flag cell, a time taken to execute a read operation may increase since the flag cell must be read. On contrast, in embodiments of the inventive concept as will be described herein, a state of each word line (i.e., an LSB program state or an MSB program state) may be determined without use of a flag cell. This may be accomplished determining a state of each word line at a firmware level using program depth information of each word line. In this case, a time taken to determine a state of a flag cell may be excluded from a read time. Also, LSB page data may be read according to a read sequence decided by the program depth information of each word line. That is, in the case of the inventive concept, two read operations may not be needed in order to determine page data according to whether a selected word line is at an LSB program state or an MSB program state. This will be more fully described later.

Figure 2:
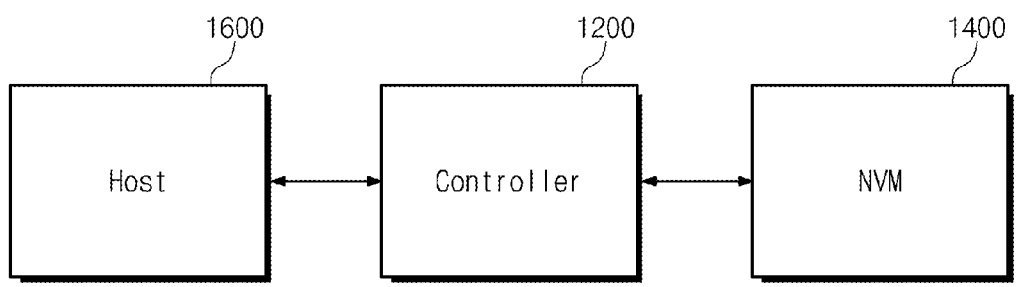
FIG. 2 is a block diagram schematically illustrating a memory system according to an embodiment of the inventive concept.

FIG. 2 is a block diagram schematically illustrating a memory system according to an embodiment of the inventive concept.

Referring to FIG. 2, a memory system according to an embodiment of the inventive concept may include a memory controller 1200 and a nonvolatile memory device 1400 as a multi-bit/multi-level memory device. The memory controller 1200 may be configured to control the nonvolatile memory device 1400 according to an external request (e.g., a write request, a read request, etc.). The memory controller 1200 may be configured to control the nonvolatile memory device 1400 according to an internal request (e.g., an operation associated with sudden power-off, a wear-leveling operation, a read reclaim operation, etc.) without an external request. An operation corresponding to an internal request of the memory controller 1200 may be executed within a timeout period of a host after a host request is processed. Alternatively, an operation corresponding to an internal request of the memory controller 1200 may be executed within an idle time of the memory controller 1200.

The nonvolatile memory device 1400 may operate responsive to the control of the memory controller 1200, and may be used as a type of storage medium which stores data information. The storage medium may be formed of one or more memory chips. The nonvolatile memory device 1400 may communicate with the memory controller 1200 via one or more channels. The nonvolatile memory device 1400 may include a NAND flash memory device, for example. In the event that the nonvolatile memory device 1400 is a memory device storing 2-bit data per cell, 2-page data (below, referred to as LSB page data and MSB page data) may be stored at memory cells connected with each word line.

The memory controller 1200 may be configured to manage a program depth map based on a write request of a host 1600. The program depth map may include information indicating whether each of word lines of the nonvolatile memory device 1400 is at an LSB program state or an MSB program state. The program depth map may be referred at a read request of the host 1600. For example, the program depth map may be used to determine whether a word line corresponding to a read request of the host 1600 is at an LSB program state or an MSB program state. The memory controller 1200 may output a read command, corresponding to the determination result, from among different read commands to the nonvolatile memory device 1400. Herein, the different read commands may include a first command indicating a read operation when a word line is at an LSB program state and a second command indicating a read operation when a word line is at an MSB program state. Referring to the examples of FIGS. 1A and 1B, when the first read command is received, the nonvolatile memory device 1400 may perform a read operation using a read voltage R0. When the second read command is received, the nonvolatile memory device 1400 may perform a read operation using a read voltage R2 or read operations using read voltages R1 and R3. The read operation using the read voltage R2 and the read operations using the read voltages R1 and R3 may be decided on the basis of a page address included in a row address provided from the memory controller 1200.

As understood from the above description, the nonvolatile memory device 1400 may execute a read operation on the basis of a read sequence decided according to an input read command. This may mean that a time taken to determine information of a flag cell and/or a time taken to perform an additional read operation (e.g., an R0 read operation described in FIG. 1B) are not required. Thus, it is possible to improve the read performance of the memory system.

In example embodiments, the nonvolatile memory device 1400 may not include flag cells for storing information indicating whether each word line is at an LSB program state or an MSB program state. However, the inventive concept is not limited thereto. For example, the nonvolatile memory device 1400 may include flag cells for storing information indicating whether each word line is at an LSB program state or an MSB program state. In this case, information stored at the flag cells may not be used to decide read sequences described with reference to FIGS. 1A and 1B. For example, information stored at the flag cells may be used to recover the program depth map if necessary. Alternatively, information stored at the flag cells may be used to initially populate the program depth map at power-up.

In example embodiments, the memory controller 1200 and the nonvolatile memory device 1400 may constitute a multi-media card (MMC) or an embedded MMC (eMMC) directly mounted on a board of a portable electronic device. However, the inventive concept is not limited thereto.

Figure 3:
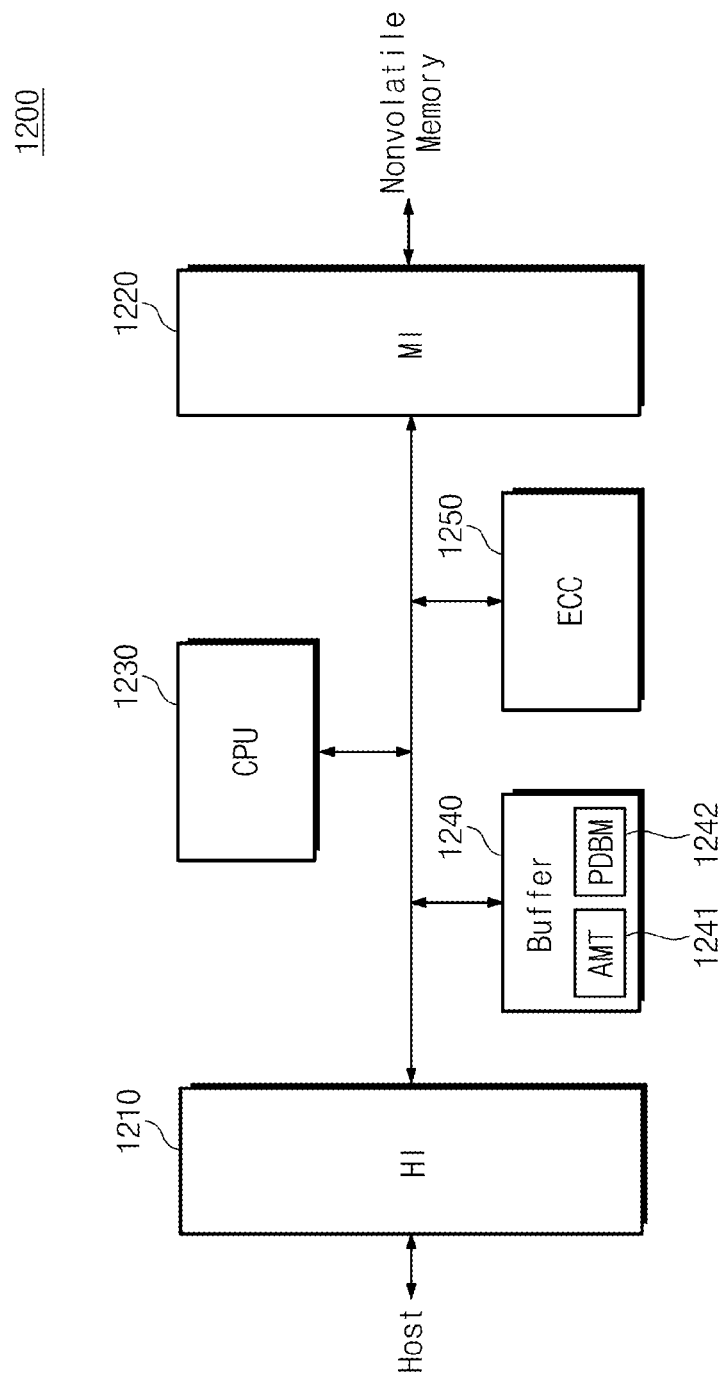
FIG. 3 is a block diagram schematically illustrating an example of a memory controller shown in FIG. 2.
Figure 4:
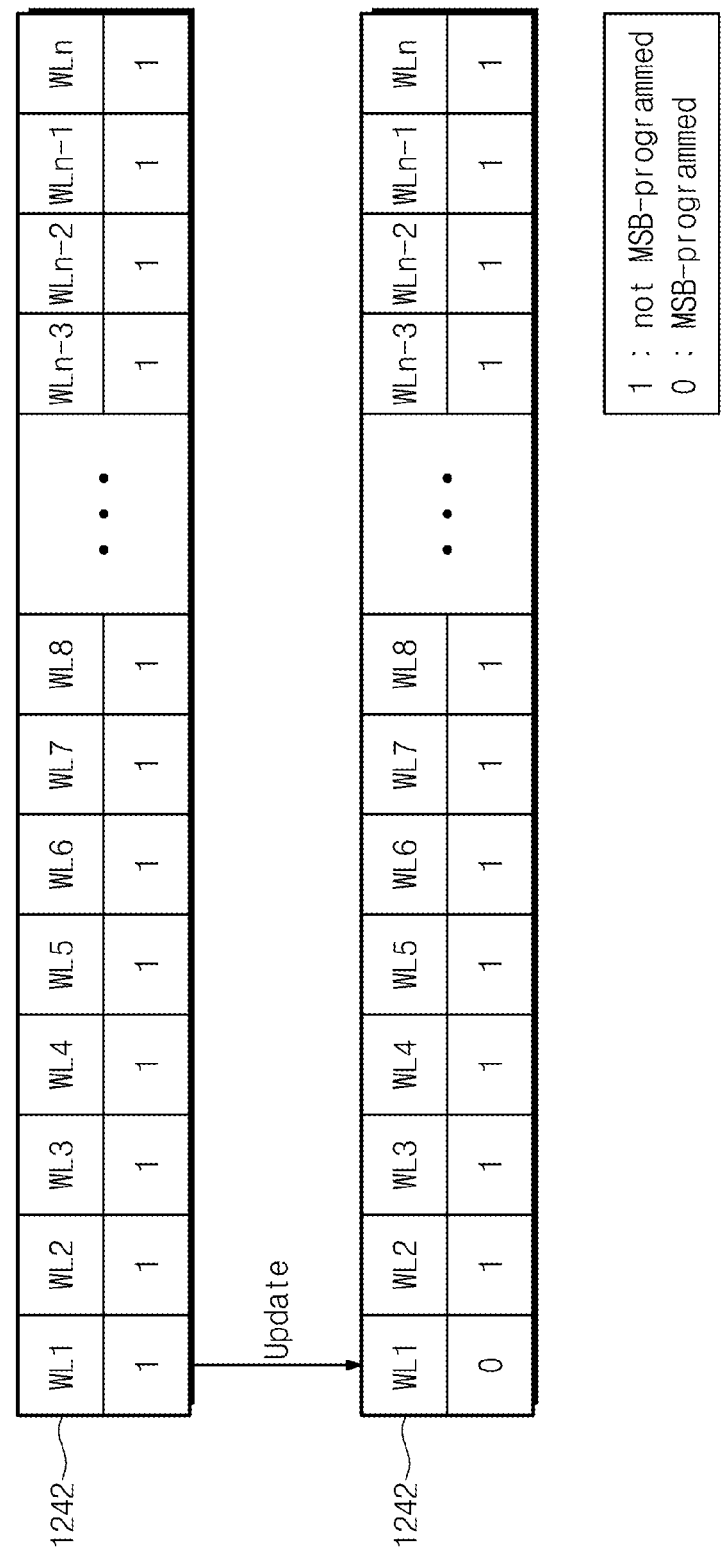
FIG. 4 is a diagram schematically illustrating an example of a program depth bit map loaded onto a buffer memory shown in FIG. 2.

FIG. 3 is a block diagram schematically illustrating an example of a memory controller shown in FIG. 2. FIG. 4 is a diagram schematically illustrating an example of a program depth bit map loaded onto a buffer memory shown in FIG. 2.

Referring to FIG. 3, a memory controller 1200 may include a host interface 1210 as a first interface, a memory interface 1220 as a second interface, a CPU 1230, a buffer memory 1240, and an error detecting and correcting circuit (ECC) 1250.

The host interface 1210 may be configured to interface with an external device (for example, a host), and the memory interface 1220 may be configured to interface with a nonvolatile memory device 1400 illustrated in FIG. 2. The CPU 1230 may be configured to control an overall operation of the controller 1200. The CPU 1230 may be configured to operate firmware such as Flash Translation Layer (FTL), for example. The FTL may perform a variety of functions. For example, the FTL may include a variety of layers performing an address mapping operation, a read reclaim operation, an error correction operation, and so on. The buffer memory 1240 may be used to temporarily store data to be transferred from an external device via the host interface 1210 or data to be transferred from the nonvolatile memory device 1400 via the memory interface 1220. The buffer memory 1240 may be formed of DRAM, SRAM, or a combination of DRAM and SRAM. However, the inventive concept is not limited thereto. The ECC 1250 may be configured to encode data to be stored in the nonvolatile memory device 1400 and to decode data read out from the nonvolatile memory device 1400.

The buffer memory 1240 may be used to store information necessary to control the nonvolatile memory device 1400. For example, an address mapping table 1241 and a program depth bit map 1242 may be stored at the buffer memory 1240. The address mapping table 1241 may be used to store a mapping relation between logical addresses provided from a host 1600 and physical addresses of the nonvolatile memory device 1400. The program depth bit map 1242 may be used to store program depth information indicating an MSB program state on each word line of the nonvolatile memory device 1400.

Referring to FIG. 4, for example, the program depth bit map 1242 may include bit information respectively corresponding to word lines WL1 to WLn of the nonvolatile memory device 1400. Bit information may have an initial value of "1", respectively. The bit information of "1" may indicate that a word line is at an LSB program state or an erase state, that is, is not at an MSB program state. The bit information of the program depth bit map 1242 may be changed (or updated) according to a write request of the host 1600. In other words, the bit information of the program depth bit map 1242 may be changed (or updated) according to a physical address of the memory controller 1200 at a write request of the host 1600. When a write operation on a specific word line is requested twice (or, an MSB program operation on a specific word line is requested), bit information of the specific word line may be changed from "1" to "0". A change of the bit information may be accomplished by updating the program depth bit map 1242 stored at the buffer memory 1240. Whether an MSB program operation on the specific word line is required may be determined on the basis of an address of a page to be accessed (e.g., a physical page address of each word line). However, a reference for determining whether an MSB program operation on the specific word line is required is not limited to the examples of this disclosure.

At a read request of the host 1600, the memory controller 1200 may determine whether a word line corresponding to a page at which read-requested data is stored is at an MSB program state. This may be performed on the basis of the program depth bit map 1242. When bit information of the program depth bit map 1242 indicates that a word line to be accessed is not at an MSB program state, the memory controller 1200 may provide the nonvolatile memory device 1400 with a first read command accompanying a read operation using a read voltage R0. When the first read command is received, the nonvolatile memory device 1400 may perform a read operation using the read voltage R0. Herein, a read sequence corresponding to the first read command may not include an operation of determining a state of a flag cell.

When bit information of the program depth bit map 1242 indicates that a word line to be accessed is at an MSB program state, the memory controller 1200 may provide the nonvolatile memory device 1400 with a second read command accompanying a read operation using a read voltage R2 or read operations using read voltages R1 and R3. When the second read command is received, the nonvolatile memory device 1400 may perform a read operation using the read voltage R2 or read operations using the read voltages R1 and R3. Herein, a read sequence corresponding to the second read command may not include an operation of determining a state of a flag cell. The read operation using the read voltage R2 may be performed when a page address of the word line to be accessed corresponds to an LSB page. The read operations using the read voltages R1 and R3 may be performed when a page address of the word line to be accessed corresponds to an MSB page.

The memory controller 1200 of the inventive concept may generate different read commands based on program depth information on a word line to be accessed, and the nonvolatile memory device 1400 may perform a read sequence corresponding to an input read command. In this case, a memory system of the inventive concept may not need flag cells for storing program states of word lines. This may mean that a time taken to determine information of a flag cell and/or a time taken to perform an additional read operation are not required. Thus, it is possible to improve the read performance of the memory system.

Although not illustrated in figures, the memory controller 1200 may further include a randomizer/de-randomizer which is configured to randomize data to be stored in the nonvolatile memory device 1400 and to de-randomize data read from the nonvolatile memory device 1400. An example of the randomizer/de-randomizer is disclosed in U.S. Patent Publication No. 2010/0088574, the entire contents of which are hereby incorporated by reference.

In example embodiments, the host interface 1210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, 120, SPI, EIA/RS-485, USB, Camera Link, External PCIe, Light Peak, Multidrop Bus, and the like.

Figure 5:
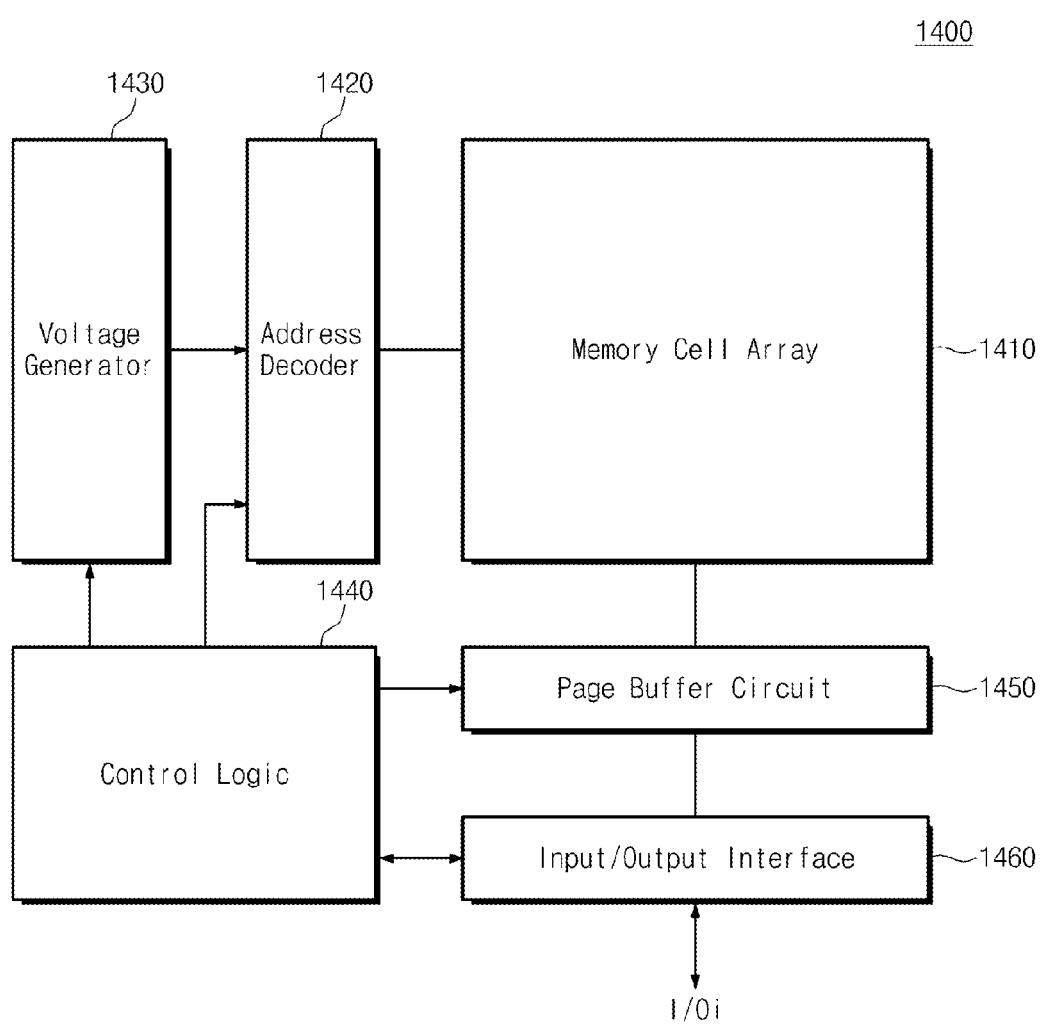
FIG. 5 is a block diagram schematically illustrating an example of a nonvolatile memory device shown in FIG. 2.

FIG. 5 is a block diagram schematically illustrating an example of a nonvolatile memory device shown in FIG. 2.

A nonvolatile memory device 1400 may be a NAND flash memory device, for example. However, it is well understood that the nonvolatile memory device 1400 is not limited to the NAND flash memory device. For example, the inventive concept may be applied to a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure, and example of which is described later with reference to FIG. 15. A nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate.

Referring to FIG. 5, the nonvolatile memory device 1400 may include a memory cell array 1410, an address decoder 1420, a voltage generator 1430, control logic 1440, a page buffer circuit 1450, and an input/output interface 1460.

The memory cell array 1410 may include memory cells arranged at intersections of rows (e.g., word lines) and columns (e.g., bit lines). Each memory cell may store 1-bit data or M-bit data as multi-bit data (M being an integer of 2 or more). In contrast to a later embodiment of FIG. 6, the memory cell array 1410 of this embodiment does not include flag cells for storing program states of the word lines. The address decoder 1420 may be controlled by the control logic 1440, and may perform selecting and driving operations on rows (e.g., word lines, a string selection line(s), a ground selection line(s), a common source line, etc.) of the memory cell array 1410. The voltage generator 1430 may be controlled by the control logic 1440, and may generate voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420.

The page buffer circuit 1450 may be controlled by the control logic 1440, and may be configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device (e.g., a memory controller 1200 shown in FIG. 2). Although not illustrated in FIG. 5, the input/output interface 1460 may include a column decoder configured to select page buffers of the page buffer circuit 1450 by a predetermined unit, an input buffer receiving data, an output buffer outputting data, and so on.

The control logic 1440 may be configured to control an overall operation of the nonvolatile memory device 1400. The control logic 1440 may determine whether a read command provided from the memory controller 1200 is a first read command accompanying a read operation using a read voltage R0. If the read command provided from the memory controller 1200 is the first read command, the control logic 1440 may control the voltage generator circuit 1430 to generate the read voltage R0. Afterwards, a read operation may be performed under a control of the control logic 1440, with the read voltage R0 being applied to a selected word line.

If the read command provided from the memory controller 1200 is determined not to be the first read command, the control logic 1440 may determine whether a page address input together with the read command is an LSB page address. If the input page address is the LSB page address, the control logic 1440 may control the voltage generator circuit 1430 to generate the read voltage R2. Afterwards, a read operation may be performed under a control of the control logic 1440, with the read voltage R2 being applied to a selected word line. If the input page address is not the LSB page address, the control logic 1440 may control the voltage generator circuit 1430 to generate the read voltages R1 and R3 sequentially. Afterwards, read operations may be sequentially performed under a control of the control logic 1440, with each of the read voltages R1 and R3 being applied to a selected word line.

In example embodiments, the address decoder 1420, the voltage generator 1430, and the page buffer circuit 1450 may constitute the read/write circuit configured to read data from the memory cell array 1410 and to store data at the memory cell array 1410. Alternatively, the page buffer circuit 1450 may constitute the read/write circuit configured to read data from the memory cell array 1410 and to store data at the memory cell array 1410.

Figure 6:
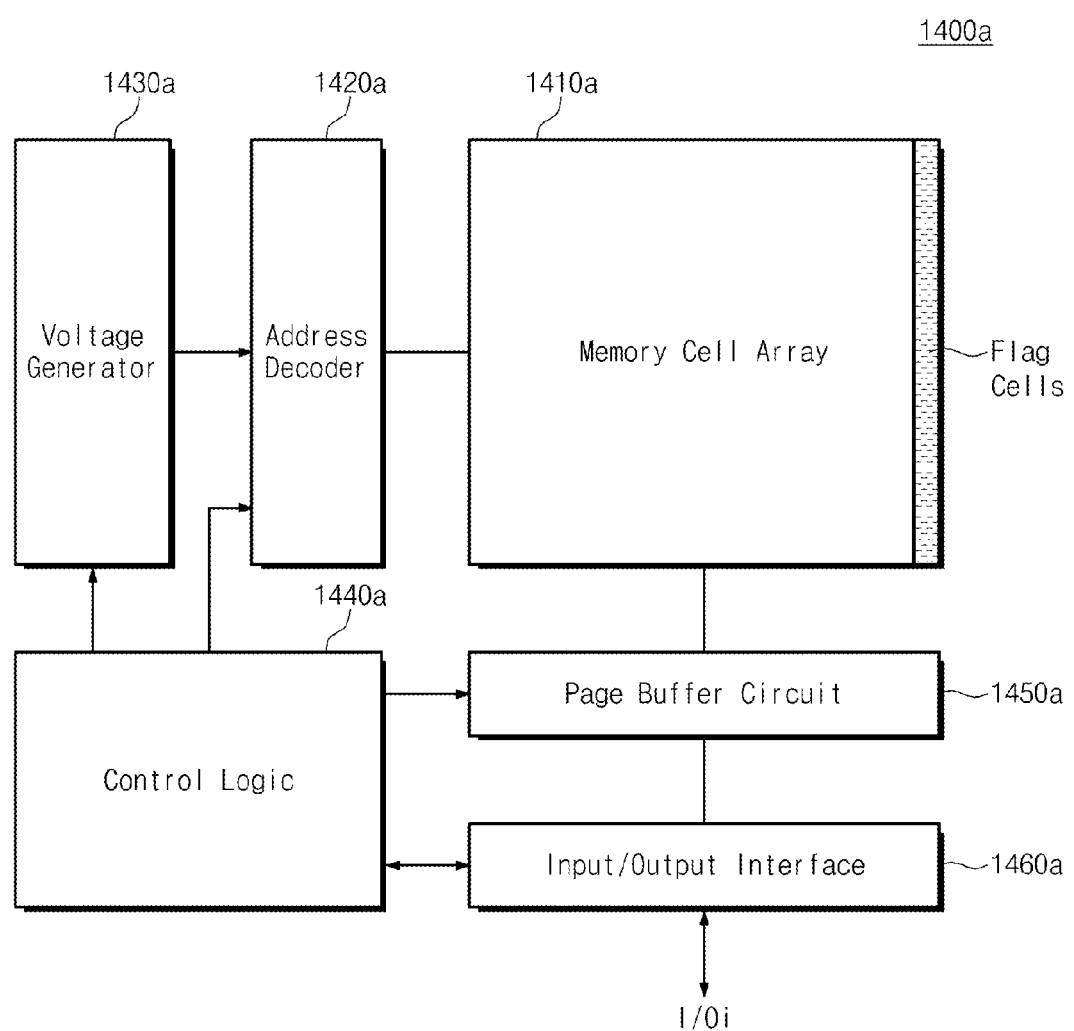
FIG. 6 is a block diagram schematically illustrating a nonvolatile memory device of FIG. 2 according to another embodiment of the inventive concept.

FIG. 6 is a block diagram schematically illustrating a nonvolatile memory device of FIG. 2 according to another embodiment of the inventive concept.

Referring to FIG. 6, a nonvolatile memory device 1400*a* may include a memory cell array 1410*a*, an address decoder 1420*a*, a voltage generator 1430*a*, control logic 1440*a*, a page buffer circuit 1450*a*, and an input/output interface 1460*a*. Except for the memory cell array 1410*a*, the nonvolatile memory device 1400*a* of FIG. 6 is the same as that of FIG. 5 described previously, and thus the description here is focused on the memory cell array 1410*a* to avoid redundancy.

The memory cell array 1410*a* may include flag cells for storing program states of word lines. The flag cells may be programmed at MSB program operations of word lines. Program state information stored at the flag cells may be used to make a program depth bit map 1242 at power-up or sudden power-off, not used at a normal read operation. However, the inventive concept is not limited thereto.

Figure 7:
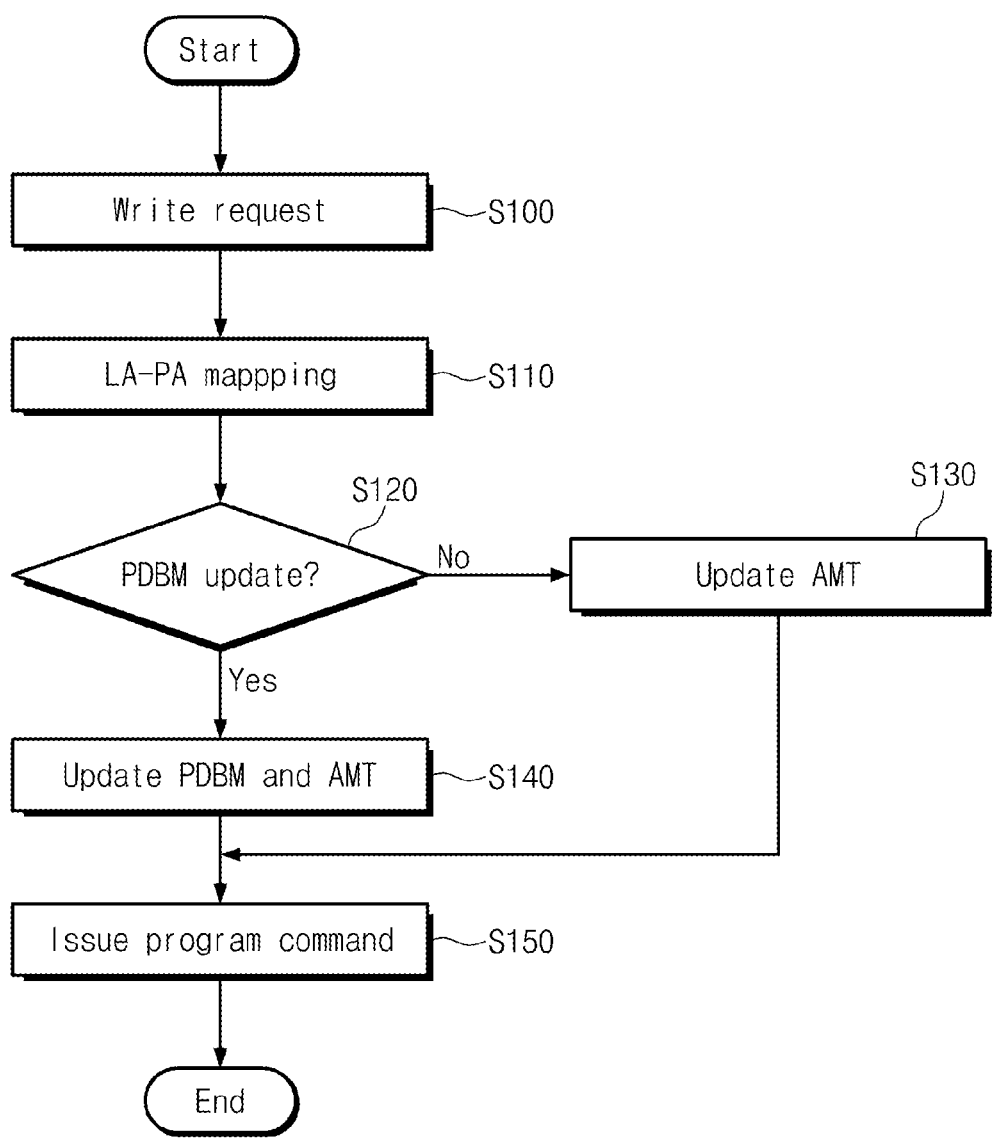
FIG. 7 is a flowchart for reference in describing a write operation method of a memory controller according to an embodiment of the inventive concept.

FIG. 7 is a flowchart schematically illustrating a write operation method of a memory controller according to an embodiment of the inventive concept. Below, a write operation method of a memory controller according to an embodiment of the inventive concept will be more fully described with reference to accompanying drawings.

Referring to FIG. 7, in operation S100, a memory controller 1200 may receive a write request from a host 1600. At this time, write-requested data may be temporarily stored at a buffer memory 1240. In operation S110, the memory controller 1200 may map a logical address (LA) input together with the write request on a physical address (PA) of a nonvolatile memory device 1400. In operation S120, the memory controller 1200 may determine whether an update of a program depth bit map (PDBM) 1242 is required. For example, whether a page address of a mapped physical address is an MSB page address may be determined. If a page address of a mapped physical address is not an MSB page address, the method may proceed to operation S130, in which an address mapping table (AMT) 1241 stored at the buffer memory 1240 may be updated. Afterwards, the method may proceed to operation S150. If a page address of a mapped physical address is not an MSB page address, the method may proceed to operation S140, in which the address mapping table 1241 and the program depth bit map 1242 are updated. An update of the program depth bit map 1242 may be accomplished by changing bit information of a word line to be accessed from "1" to "0". Afterwards, the method may proceed to operation S150. In operation S150, the memory controller 1200 may provide the nonvolatile memory device 1400 with a program command and write data temporarily stored at the buffer memory 1240. Afterwards, the method may be ended.

In example embodiments, an update of the address mapping table 1241 in operations S130 and S140 may be replaced with mapping of a logical address and a physical address.

Figure 8:
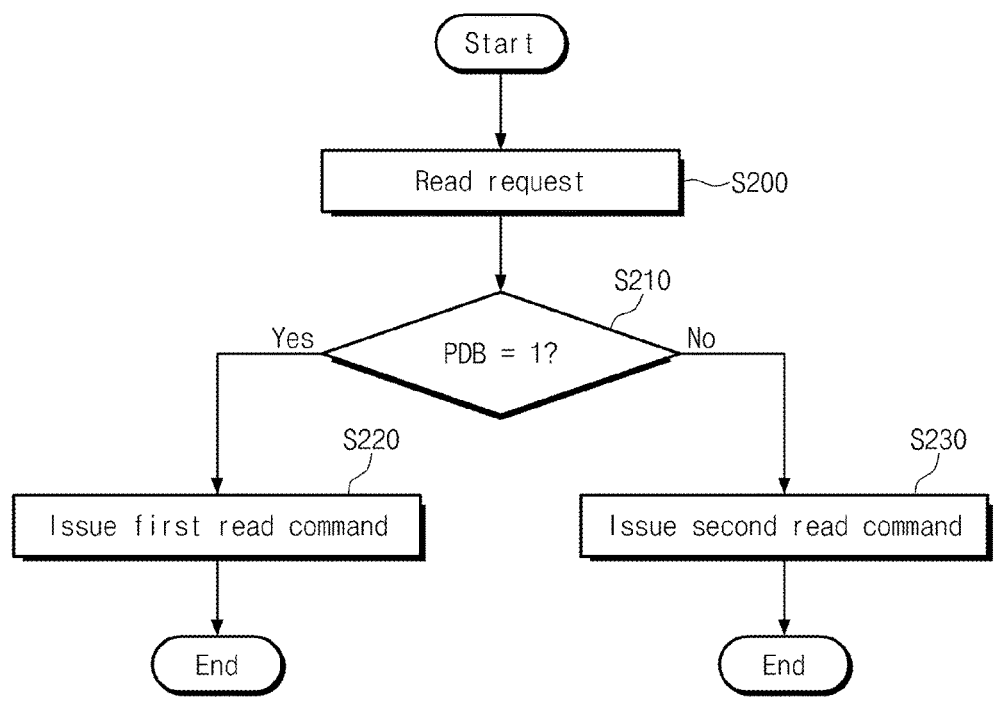
FIG. 8 is a flowchart for reference in describing a read operation method of a memory controller according to an embodiment of the inventive concept.

FIG. 8 is a flowchart schematically illustrating a read operation method of a memory controller according to an embodiment of the inventive concept. Below, a read operation method of a memory controller according to an embodiment of the inventive concept will be more fully described with reference to accompanying drawings.

Referring to FIG. 8, in operation S200, a memory controller 1200 may receive a read request from a host 1600. In operation S210, the memory controller 1200 may determine whether a word line corresponding to a page at which read-requested data is stored is at an MSB program state, based on a program depth bit map 1242 stored at a buffer memory 1240. If a word line to be accessed is determined not to be at an MSB program state (e.g., having program depth bit (PDB) information of "1"), the method may proceed to operation S220, in which the memory controller 1200 may issue a first read command to a nonvolatile memory device 1400. The first read command may be a read command indicating that a word line to be accessed is not at an MSB program state, and the nonvolatile memory device 1400 may perform a read operation using a read voltage R0 when the first read command is received.

If the word line to be accessed is determined to be at an MSB program state (e.g., having PDB information of "0"), the method may proceed to operation S230, in which the memory controller 1200 may issue a second read command to the nonvolatile memory device 1400. The second read command may be a read command indicating that a word line to be accessed is at an MSB program state, and the nonvolatile memory device 1400 may perform a read operation using a read voltage R2 or read voltages R1 and R3 when the second read command is received. Afterwards, the method may be ended.

Figure 9:
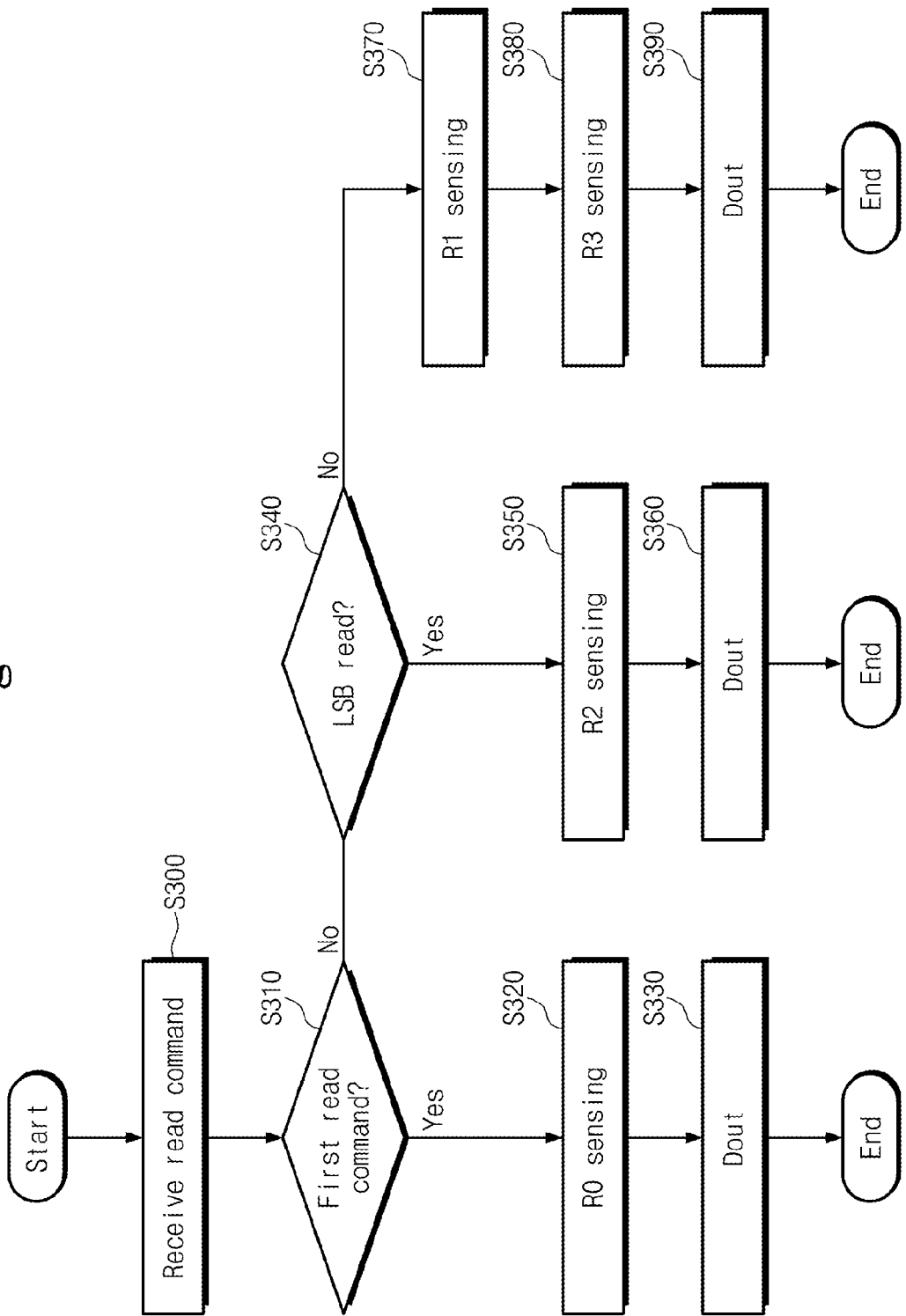
FIG. 9 is a flowchart for reference in describing a read method of a nonvolatile memory device according to an embodiment of the inventive concept.

FIG. 9 is a flowchart schematically illustrating a read method of a nonvolatile memory device according to an embodiment of the inventive concept. Below, a read method of a nonvolatile memory device according to an embodiment of the inventive concept will be more fully described with reference to accompanying drawings.

Referring to FIG. 9, in operation S300, a nonvolatile memory device 1400 may receive a read command from a memory controller 1200. In operation S310, whether the input read command is a first read command may be determined by control logic 1440. When the input read command is determined to be the first read command, the method may proceed to operation S320. Here, the case where the input read command is the first read command may mean that a word line to be accessed is not at an MSB program state. In operation S320, a sensing operation using a read voltage R0 may be performed. For example, the control logic 1440 may control a voltage generator circuit 1430 such that the read voltage R0 is generated. A sensing operation may be performed through a page buffer circuit 1450 with the read voltage R0 being applied to the word line to be accessed. In operation S330, sensed data may be output to the memory controller 1200 as read-requested data.

Returning to operation S310, if the input read command is not the first read command, the method may proceed to operation S340. Here, the case where the input read command is not the first read command may mean that a word line to be accessed is at an MSB program state. In operation S340, whether a read operation of the word line to be accessed is an LSB read operation may be determined. That is, whether a page address of the word line to be accessed is an LSB page address may be determined. In the event that a page address of the word line to be accessed is an LSB page address, the method may proceed to operation S350, in which a sensing operation using a read voltage R2 is performed. For example, the control logic 1440 may control the voltage generator circuit 1430 such that the read voltage R2 is generated. A sensing operation may be performed through the page buffer circuit 1450 with the read voltage R2 being applied to the word line to be accessed. In operation S330, sensed data may be output to the memory controller 1200 as read-requested data.

Returning to operation S340, if a page address of the word line to be accessed is not an LSB page address, the method may proceed to operation S370. In operation S370, a sensing operation using a read voltage R1 is performed. For example, the control logic 1440 may control the voltage generator circuit 1430 such that the read voltage R1 is generated. A sensing operation may be performed through the page buffer circuit 1450 with the read voltage R1 being applied to the word line to be accessed. In operation S380, a sensing operation using a read voltage R3 is performed. For example, the control logic 1440 may control the voltage generator circuit 1430 such that the read voltage R3 is generated. A sensing operation may be performed through the page buffer circuit 1450 with the read voltage R3 being applied to the word line to be accessed. In operation S390, a combination of data sensed using the read voltages R1 and R3 may be output to the memory controller 1200 as read-requested data. Afterwards, the method may be ended.

Figure 10:
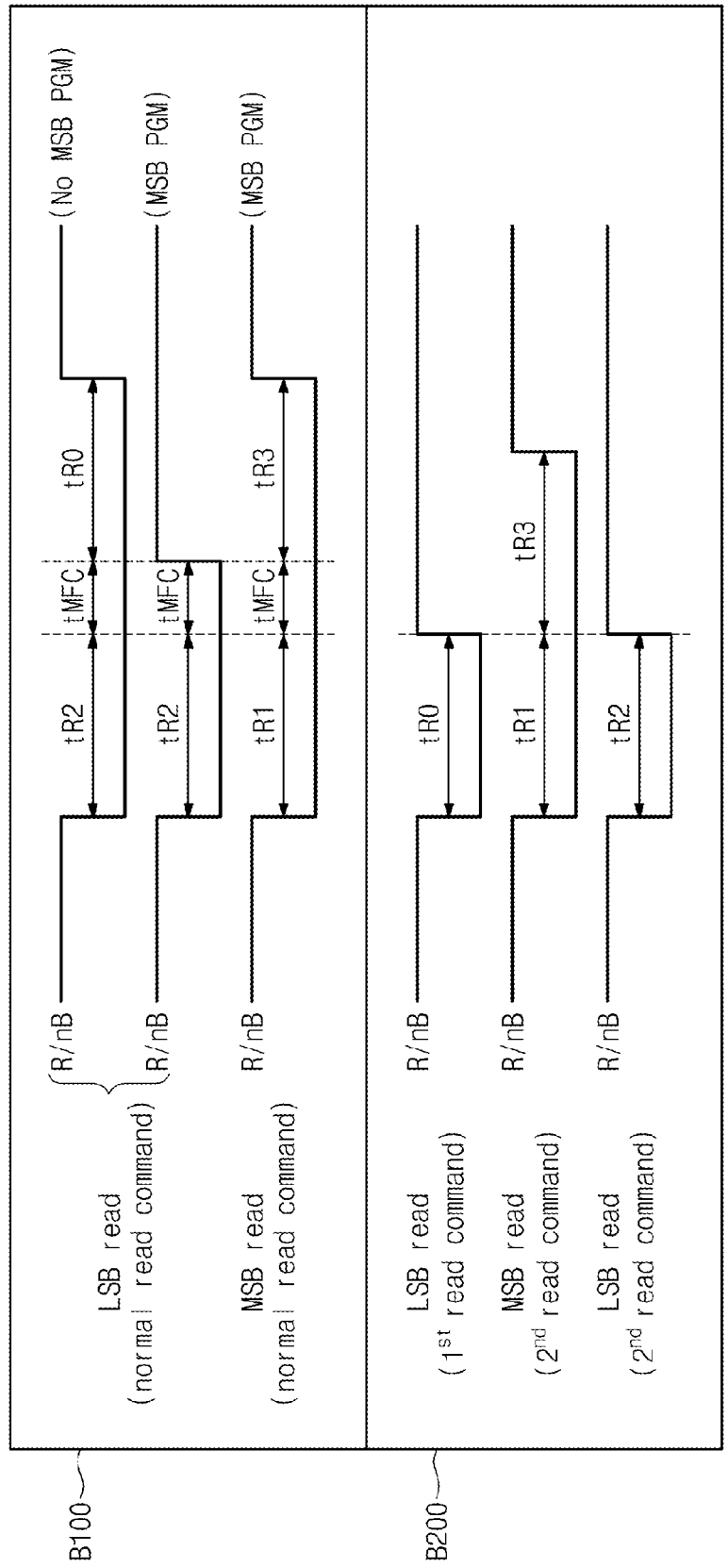
FIG. 10 is a diagram for reference in describing an improvement in read performance of a memory system according to the inventive concept.

FIG. 10 is a diagram for reference in describing an improvement in read performance of a memory system according to embodiments of the inventive concept. In FIG. 10, a block B100 may show read times (where R/nB is low) taken to perform an LSB page read operation and an MSB page read operation in a conventional manner using a flag cell. A block B200 may show read times taken to perform an LSB page read operation and an MSB page read operation using a program depth bit map 1242, i.e., without using a flag cell.

In the case of using a flag cell, at an LSB page read operation, a sensing operation using a read voltage R2 may be performed during tR2. At this time, data of a flag cell may be also sensed. Whether data read from the flag cell indicates an LSB program state or an MSB program state may be determined during tMFC. If data read from the flag cell indicates an LSB program state, a sensing operation using a read voltage R0 may be additionally performed during tR0. Data sensed using the read voltage R0 may be output as read-requested data. If data read from the flag cell indicates an MSB program state, data sensed using the read voltage R2 may be output as read-requested data.

In the case of using a flag cell at an MSB page read operation, a sensing operation using a read voltage R1 may be performed during tR1. At this time, data of a flag cell may be also sensed. Whether data read from the flag cell indicates an LSB program state or an MSB program state may be determined during tMFC. If data read from the flag cell indicates an MSB program state, a sensing operation using a read voltage R3 may be performed during tR3. A combination of data sensed using the read voltages R1 and R3 may be output as read-requested data. If data read from the flag cell indicates an LSB program state, a page buffer circuit 1450 may be set to a set state (e.g., data "1"), and data of the set state may be output as read-requested data.

The conventional use of a flag cell and a single read command may thus necessitate an execution time tMFC to determine whether data read from the flag cell indicates an MSB program state.

In the case of a memory system of embodiments of the inventive concept, referring to block B200, when a first read command is received, a sensing operation using the read voltage R0 may be performed during tR0. Data sensed using the read voltage R0 may be output as read-requested data. When a second read command is received, whether a page address input with the second read command is an LSB page address may be determined. When the input page address is the LSB page address, a read operation using the read voltage R2 may be executed during tR2. Data sensed using the read voltage R2 may be output as read-requested data. When the input page address is the MSB page address, a read operation using the read voltage R1 may be executed during tR1 a read operation using the read voltage R3 may be executed during tR3. A combination of data sensed using the read voltages R1 and R3 may be output as read-requested data.

Compared with a read operation using a flag cell, embodiments of the inventive concept may not require a time tMFC taken to determine whether data read from the flag cell indicates an MSB program state. Thus, the read performance of a memory system according to embodiments of the inventive concept may be improved. Compared with the read operation using a flag cell, times tR2 and tR0 taken to perform an LSB page read operation may be equal to each other regardless of whether an MSB page program operation on a selected word line is performed. Also, different read commands may be provided from a memory controller 1200 according to whether a selected word line is at an MSB program state.

Figure 11:
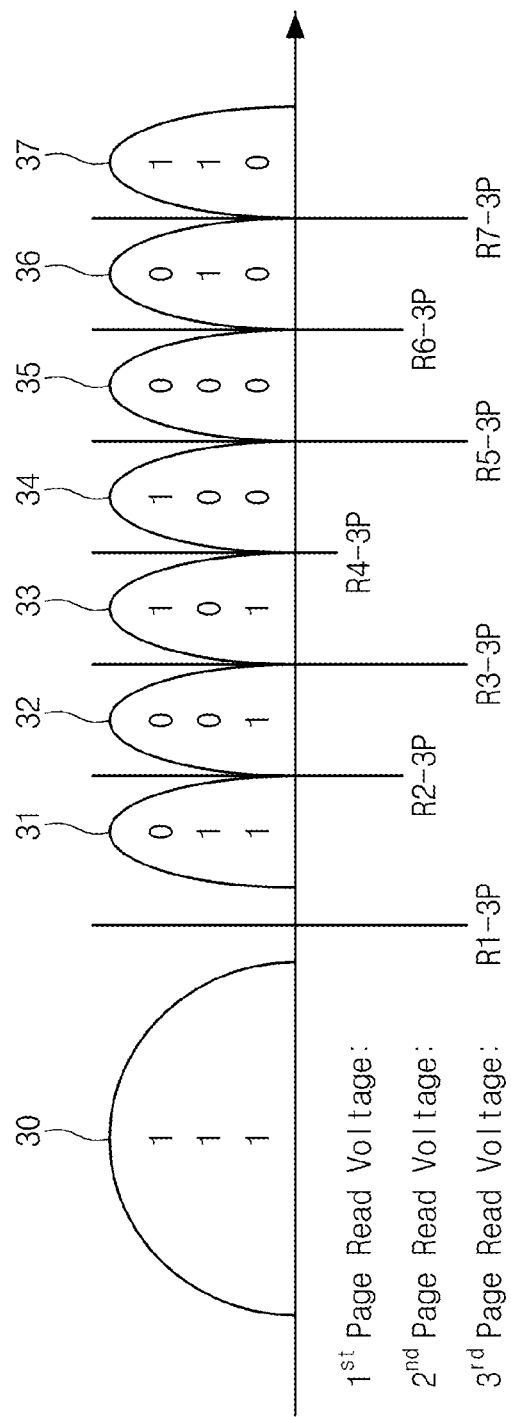
FIG. 11 is a diagram schematically illustrating an example of threshold voltage distributions of a nonvolatile memory device storing 3-bit data per cell.

FIG. 11 is a diagram schematically illustrating threshold voltage distributions of a nonvolatile memory device storing 3-bit data per cell.

In a nonvolatile memory device storing 3-bit data per cell, a memory cell may have one of a plurality of states 30 to 37 illustrated in FIG. 11. 3-page data may be stored at memory cells connected with each word line. For example, the lowermost page data (or, first page data), intermediate page data (or, second page data), and the uppermost page data (or, third page data) may be stored at memory cells connected with each word line. A bit ordering illustrated in FIG. 11 may be exemplary, and the inventive concept is not limited thereto.

The lowermost page data may be read from memory cells with a read voltage R4-3P being applied to a selected word line. The intermediate page data may be a combination of data read from memory cells with a read voltage R2-3P being applied to a selected word line and data read from memory cells with a read voltage R6-3P being applied to the selected word line. The uppermost page data may be a combination of data read from memory cells with a read voltage R1-3P being applied to a selected word line, data read from memory cells with a read voltage R3-3P being applied to the selected word line, data read from memory cells with a read voltage R5-3P being applied to the selected word line, and data read from memory cells with a read voltage R7-3P being applied to the selected word line.

A page to be read requested among pages in a selected word line may be determined according to page address information as described above.

In the event that 3-bit data is stored at each memory cell, a memory controller 1200 may manage a program depth bit map 1242 including bit information corresponding to each word line. The bit information of the program depth bit map 1242 may be changed (or updated) according to a write request of a host 1600. For example, when a write operation on a specific word line is requested twice, bit information of the specific word line may be changed from "1" to "0". A change of the bit information may be accomplished by updating the program depth bit map 1242 stored at a buffer memory 1240. Whether an upper program operation on a specific word line (e.g., a program operation on second or third page data) is required may be determined on the basis of an address of a page to be accessed. However, a reference for determining whether an upper program operation on the specific word line is required is not limited to the examples of this disclosure.

At a read request of a host 1600, the memory controller 1200 may determine whether a word line corresponding to a page at which read-requested data is stored is at an upper page program state. This may be performed on the basis of the program depth bit map 1242. When bit information of the program depth bit map 1242 indicates that a word line to be accessed is not at an upper page program state, the memory controller 1200 may provide the nonvolatile memory device 1400 with a first read command accompanying a read operation using a read voltage R4-3P. When the first read command is received, the nonvolatile memory device 1400 may perform a read operation using the read voltage R4-3P. Herein, a read sequence corresponding to the first read command may not include an operation of determining a state of a flag cell.

When bit information of the program depth bit map 1242 indicates that a word line to be accessed is at an upper page program state, the memory controller 1200 may provide the nonvolatile memory device 1400 with a second read command accompanying a read operation using a read voltage R4-3P, read operations using read voltages R2-3P and R6-3P, or read operations using read voltages R1-3P, R3-3P, R5-3P, and R7-3P. When the second read command is received, the nonvolatile memory device 1400 may perform a read operation using the read voltage R4-3P, read operations using the read voltages R2-3P and R6-3P, or read operations using the read voltages R1-3P, R3-3P, R5-3P, and R7-3P. Herein, a read sequence corresponding to the second read command may not include an operation of determining a state of a flag cell.

The read operation using the read voltage R4-3P may be performed when a page address of a word line to be accessed is a first page address, the read operations using the read voltages R2-3P and R6-3P may be performed when a page address of a word line to be accessed is a second page address, and the read operations using the read voltages R1-3P, R3-3P, R5-3P, and R7-3P may be performed when a page address of a word line to be accessed is a third page address.

The memory controller 1200 of embodiments of the inventive concept may generate different read commands based on program depth information on a word line to be accessed, and the nonvolatile memory device 1400 may perform a read sequence corresponding to an input read command. In this case, a memory system of the inventive concept may not need to read flag cells which store program states of word lines. This may mean that a time taken to determine information of a flag cell and/or a time taken to perform an additional read operation are not required. Thus, it is possible to improve the read performance of the memory system.

Figure 12:
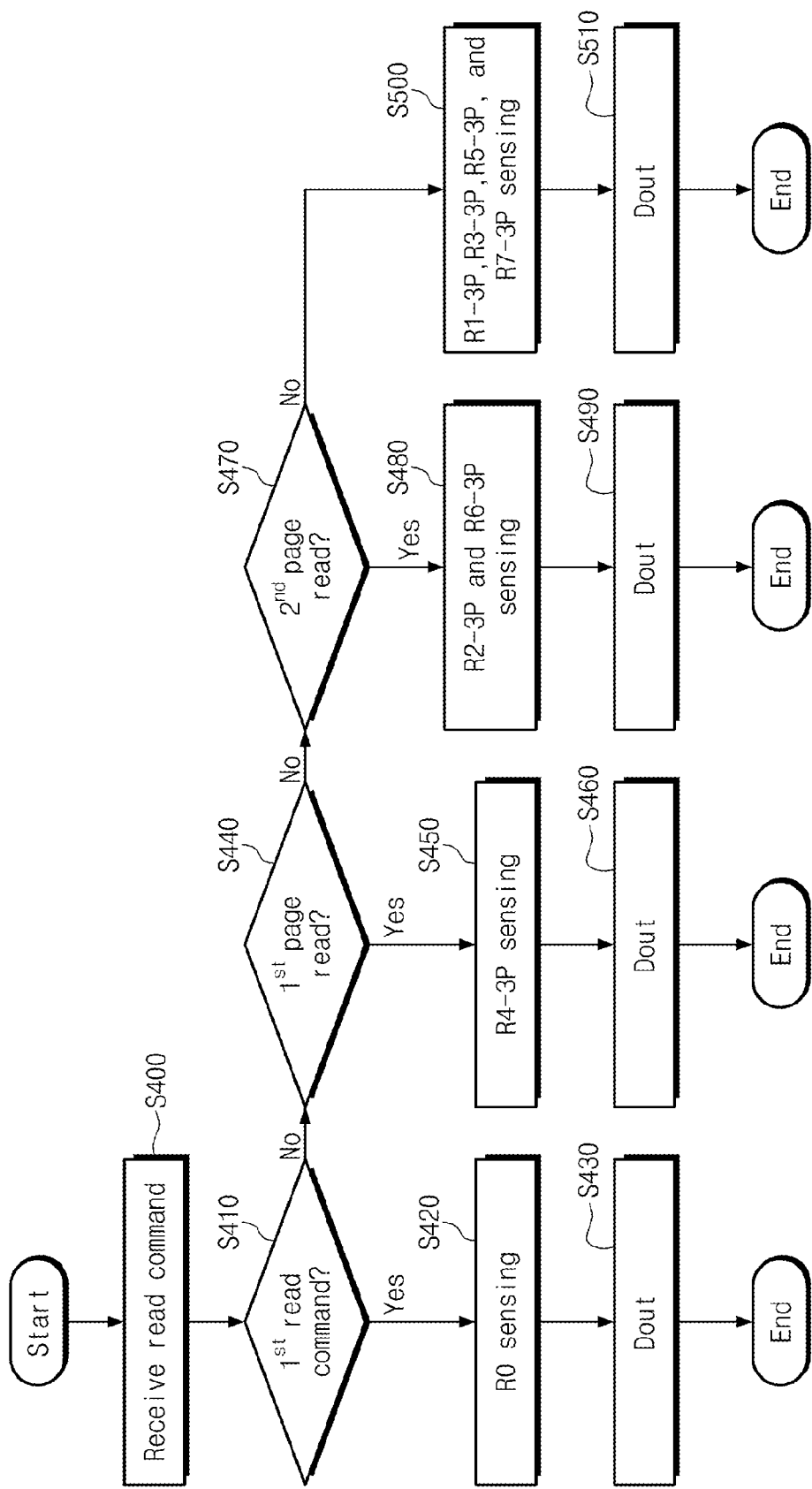
FIG. 12 is a flowchart for reference in describing a read method of a nonvolatile memory device according to another embodiment of the inventive concept.

FIG. 12 is a flowchart schematically illustrating a read method of a nonvolatile memory device according to another embodiment of the inventive concept. Below, a read method of a nonvolatile memory device according to another embodiment of the inventive concept will be more fully described with reference to accompanying drawings.

Referring to FIG. 12, in operation S400, a nonvolatile memory device 1400 may receive a read command from a memory controller 1200. In operation S410, whether the input read command is a first read command may be determined by control logic 1440. When the input read command is determined to be the first read command, the method may proceed to operation S420. Here, the case where the input read command is the first read command may mean that a word line to be accessed is not at an upper page program state. In operation S420, a sensing operation using a read voltage R0 (refer to FIG. 1A) may be performed. For example, the control logic 1440 may control a voltage generator circuit 1430 such that the read voltage R0 is generated. A sensing operation may be performed through a page buffer circuit 1450 with the read voltage R0 being applied to the word line to be accessed. In operation S430, sensed data may be output to the memory controller 1200 as read-requested data.

Returning to operation S410, if the input read command is not the first read command, the method may proceed to operation S440. Here, the case where the input read command is not the first read command may mean that a word line to be accessed is at an upper page program state. In operation S440, whether a page address of the word line to be accessed is a first page address may be determined. If a page address of the word line to be accessed is a first page address, the method may proceed to operation S450, in which a sensing operation using a read voltage R4-3P is performed. For example, the control logic 1440 may control the voltage generator circuit 1430 such that the read voltage R4-3P is generated. A sensing operation may be performed through the page buffer circuit 1450 with the read voltage R4-3P being applied to the word line to be accessed. In operation S460, sensed data may be output to the memory controller 1200 as read-requested data.

Returning to operation S440, if a page address of the word line to be accessed is not a first page address, the method may proceed to operation S470, in which a read operation of the word line to be accessed is a second page read operation is determined. That is, whether a page address of the word line to be accessed is a second page address may be determined. If a page address of the word line to be accessed is a second page address, the method may proceed to operation S480, in which sensing operations using read voltages R2-3P and R6-3P are performed. In operation S490, a combination of data read through a read operation using the read voltage R2-3P and data read through a read operation using the read voltage R6-3P may be output to the memory controller 1200 as read-requested data.

Returning to operation S470, if a page address of the word line to be accessed is not a second page address, the method may proceed to operation S500, in which sensing operations using read voltages R1-3P, R3-3P, R5-3P, and R7-3P are performed. In operation S510, a combination of data read through read operations using the read voltages R1-3P, R3-3P, R5-3P, and R7-3P may be output to the memory controller 1200 as read-requested data.

Figure 13:
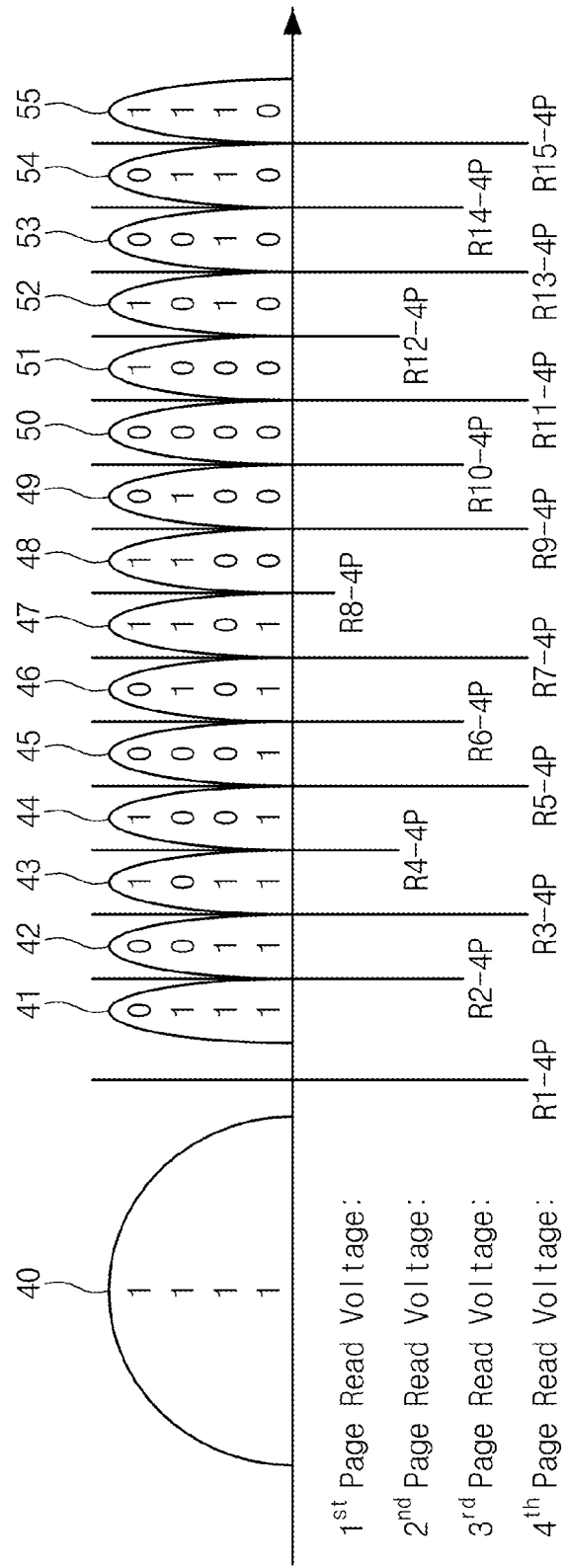
FIG. 13 is a diagram schematically illustrating an example of threshold voltage distributions of a nonvolatile memory device storing 4-bit data per cell.

FIG. 13 is a diagram schematically illustrating threshold voltage distributions of a nonvolatile memory device storing 4-bit data per cell.

In a nonvolatile memory device storing 4-bit data per cell, a memory cell may have one of a plurality of states 40 to 55 illustrated in FIG. 13. 4-page data may be stored at memory cells connected with each word line. For example, the lowermost page data (or, first page data), first intermediate page data (or, second page data), second intermediate page data (or, third page data), and the uppermost page data (or, third page data) may be stored at memory cells connected with each word line. A bit ordering illustrated in FIG. 13 may be exemplary, and the inventive concept is not limited thereto.

The lowermost page data may be read from memory cells with a read voltage R8-4P being applied to a selected word line. The first intermediate page data may be a combination of data read from memory cells with a read voltage R12-4P being applied to a selected word line and data read from memory cells with a read voltage R2-4P being applied to the selected word line. The second intermediate page data may be a combination of data read from memory cells with a read voltage R2-4P being applied to a selected word line, data read from memory cells with a read voltage R6-4P being applied to the selected word line, data read from memory cells with a read voltage R10-4P being applied to the selected word line, and data read from memory cells with a read voltage R14-4P being applied to the selected word line.

The uppermost page data may be a combination of data read from memory cells with a read voltage R1-4P being applied to a selected word line, data read from memory cells with a read voltage R3-4P being applied to the selected word line, data read from memory cells with a read voltage R5-4P being applied to the selected word line, data read from memory cells with a read voltage R7-4P being applied to the selected word line, data read from memory cells with a read voltage R9-4P being applied to the selected word line, data read from memory cells with a read voltage R11-4P being applied to the selected word line, data read from memory cells with a read voltage R13-4P being applied to the selected word line, and data read from memory cells with a read voltage R15-4P being applied to the selected word line.

A page to be read requested among pages in a selected word line may be determined according to page address information as described above.

In the event that 4-bit data is stored at each memory cell, a memory controller 1200 may manage a program depth bit map 1242 including bit information corresponding to each word line. The bit information of the program depth bit map 1242 may be changed (or updated) according to a write request of a host 1600. For example, when a write operation on a specific word line is requested twice, bit information of the specific word line may be changed from "1" to "0". A change of the bit information may be accomplished by updating the program depth bit map 1242 stored at a buffer memory 1240. Whether an upper program operation on a specific word line (e.g., a program operation on second, third or fourth page data) is required may be determined on the basis of an address of a page to be accessed. However, a reference for determining whether an upper program operation on the specific word line is required is not limited to the examples of this disclosure.

At a read request of a host 1600, the memory controller 1200 may determine whether a word line corresponding to a page at which read-requested data is stored is at an upper page program state. This may be performed on the basis of the program depth bit map 1242. When bit information of the program depth bit map 1242 indicates that a word line to be accessed is not at an upper page program state, the memory controller 1200 may provide the nonvolatile memory device 1400 with a first read command accompanying a read operation using a read voltage R8-4P. When the first read command is received, the nonvolatile memory device 1400 may perform a read operation using the read voltage R8-4P. Herein, a read sequence corresponding to the first read command may not include an operation of determining a state of a flag cell.

When bit information of the program depth bit map 1242 indicates that a word line to be accessed is at an upper page program state, the memory controller 1200 may provide the nonvolatile memory device 1400 with a second read command accompanying a read operation using a read voltage R8-4P, read operations using read voltages R4-4P and R12-4P, read operations using read voltages R2-4P, R6-4P, R10-4P, and R14-4P, or read operations using read voltages R1-4P, R3-4P, R5-4P, R7-4P, R9-4P, R11-4P, R13-4P, and R15-4P. When the second read command is received, the nonvolatile memory device 1400 may perform a read voltage R8-4P, read operations using read voltages R4-4P and R12-4P, read operations using read voltages R2-4P, R6-4P, R10-4P, and R14-4P, or read operations using read voltages R1-4P, R3-4P, R5-4P, R7-4P, R9-4P, R11-4P, R13-4P, and R15-4P. Herein, a read sequence corresponding to the second read command may not include an operation of determining a state of a flag cell.

The read operation using the read voltage R8-3P may be performed when a page address of a word line to be accessed is a first page address, the read operations using the read voltages R4-4P and R12-4P may be performed when a page address of a word line to be accessed is a second page address, the read operations using the read voltages R2-4P, R6-4P, R10-4P, and R14-4P may be performed when a page address of a word line to be accessed is a third page address, and the read operations using the read voltages R1-4P, R3-4P, R5-4P, R7-4P, R9-4P, R11-4P, R13-4P, and R15-4P may be performed when a page address of a word line to be accessed is a fourth page address.

The memory controller 1200 of embodiments of the inventive concept may generate different read commands based on program depth information on a word line to be accessed, and the nonvolatile memory device 1400 may perform a read sequence corresponding to an input read command. In this case, a memory system of the inventive concept may not need to read flag cells which store program states of word lines. This may mean that a time taken to determine information of a flag cell and/or a time taken to perform an additional read operation are not required. Thus, it is possible to improve the read performance of the memory system.

Figure 14:
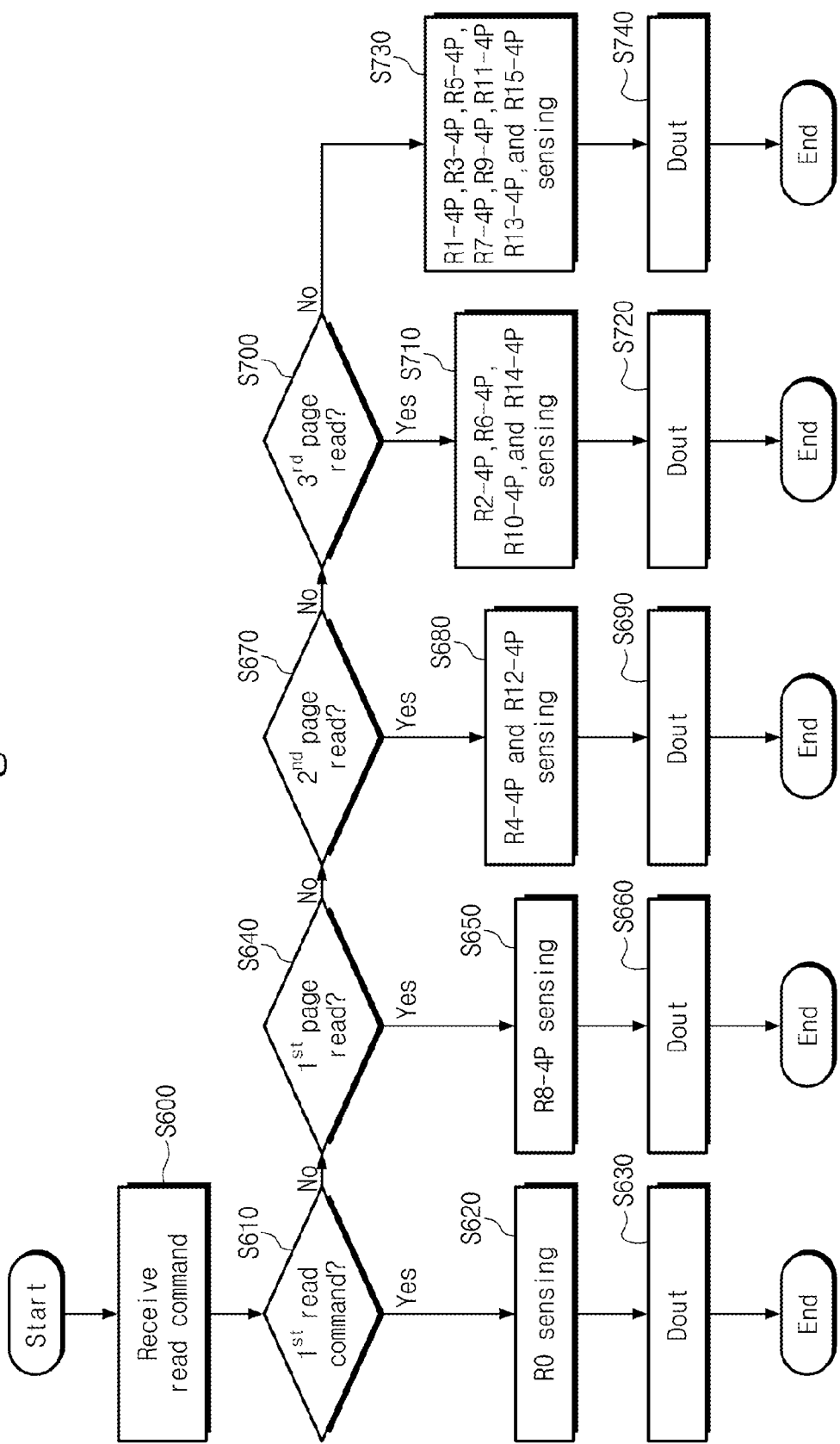
FIG. 14 is a flowchart for reference in describing a read method of a nonvolatile memory device according to still another embodiment of the inventive concept.

FIG. 14 is a flowchart schematically illustrating a read method of a nonvolatile memory device according to still another embodiment of the inventive concept. Below, a read method of a nonvolatile memory device according to still another embodiment of the inventive concept will be more fully described with reference to accompanying drawings.

Referring to FIG. 14, in operation S600, a nonvolatile memory device 1400 may receive a read command from a memory controller 1200. In operation S610, whether the input read command is a first read command may be determined by control logic 1440. When the input read command is determined to be the first read command, the method may proceed to operation S620. Here, the case where the input read command is the first read command may mean that a word line to be accessed is not at an upper page program state. In operation S620, a sensing operation using a read voltage R0 (refer to FIG. 1A) may be performed. For example, the control logic 1440 may control a voltage generator circuit 1430 such that the read voltage R0 is generated. A sensing operation may be performed through a page buffer circuit 1450 with the read voltage R0 being applied to the word line to be accessed. In operation S630, sensed data may be output to the memory controller 1200 as read-requested data.

Returning to operation S610, if the input read command is not the first read command, the method may proceed to operation S640. Here, the case where the input read command is not the first read command may mean that a word line to be accessed is at an upper page program state. In operation S640, whether a read operation of the word line to be accessed is a first page read operation may be determined. That is, whether a page address of the word line to be accessed is a first page address may be determined. If a page address of the word line to be accessed is a first page address, the method may proceed to operation S650, in which a sensing operation using a read voltage R8-4P is performed. For example, the control logic 1440 may control the voltage generator circuit 1430 such that the read voltage R8-4P is generated. A sensing operation may be performed through the page buffer circuit 1450 with the read voltage R8-4P being applied to the word line to be accessed. In operation S660, sensed data may be output to the memory controller 1200 as read-requested data.

Returning to operation S640, if a page address of the word line to be accessed is not a first page address, the method may proceed to operation S670, in which a read operation of the word line to be accessed is a second page read operation is determined. That is, whether a page address of the word line to be accessed is a second page address may be determined. If a page address of the word line to be accessed is a second page address, the method may proceed to operation S680, in which sensing operations using read voltages R4-4P and R12-4P are performed. In operation S490, a combination of data read through a read operation using the read voltage R4-4P and data read through a read operation using the read voltage R12-4P may be output to the memory controller 1200 as read-requested data.

Returning to operation S670, if a page address of the word line to be accessed is not a second page address, the method may proceed to operation S700, in which a read operation of the word line to be accessed is a third page read operation is determined. That is, whether a page address of the word line to be accessed is a third page address may be determined. If a page address of the word line to be accessed is a third page address, the method may proceed to operation S710, in which sensing operations using read voltages R2-4P, R6-4P, R10-4P, and R14-4P are performed. In operation S720, a combination of data read through a read operation using the read voltage R2-4P, data read through a read operation using the read voltage R6-4P, data read through a read operation using the read voltage R10-4P, and data read through a read operation using the read voltage R14-4P may be output to the memory controller 1200 as read-requested data.

Returning to operation S700, if a page address of the word line to be accessed is not a third page address (i.e., a page address of the word line to be accessed is a fourth page address), the method may proceed to operation S730, in which sensing operations using read voltages R1-4P, R3-4P, R5-4P, R7-4P, R9-4P, R11-4P, R13-4P, and R15-4P are performed. In operation S740, a combination of data read through a read operation using the read voltage R1-4P, data read through a read operation using the read voltage R3-4P, data read through a read operation using the read voltage R5-4P, data read through a read operation using the read voltage R7-4P, data read through a read operation using the read voltage R9-4P, data read through a read operation using the read voltage R11-4P, data read through a read operation using the read voltage R13-4P, and data read through a read operation using the read voltage R15-4P may be output to the memory controller 1200 as read-requested data. Afterwards, the method may be ended.

Figure 15:
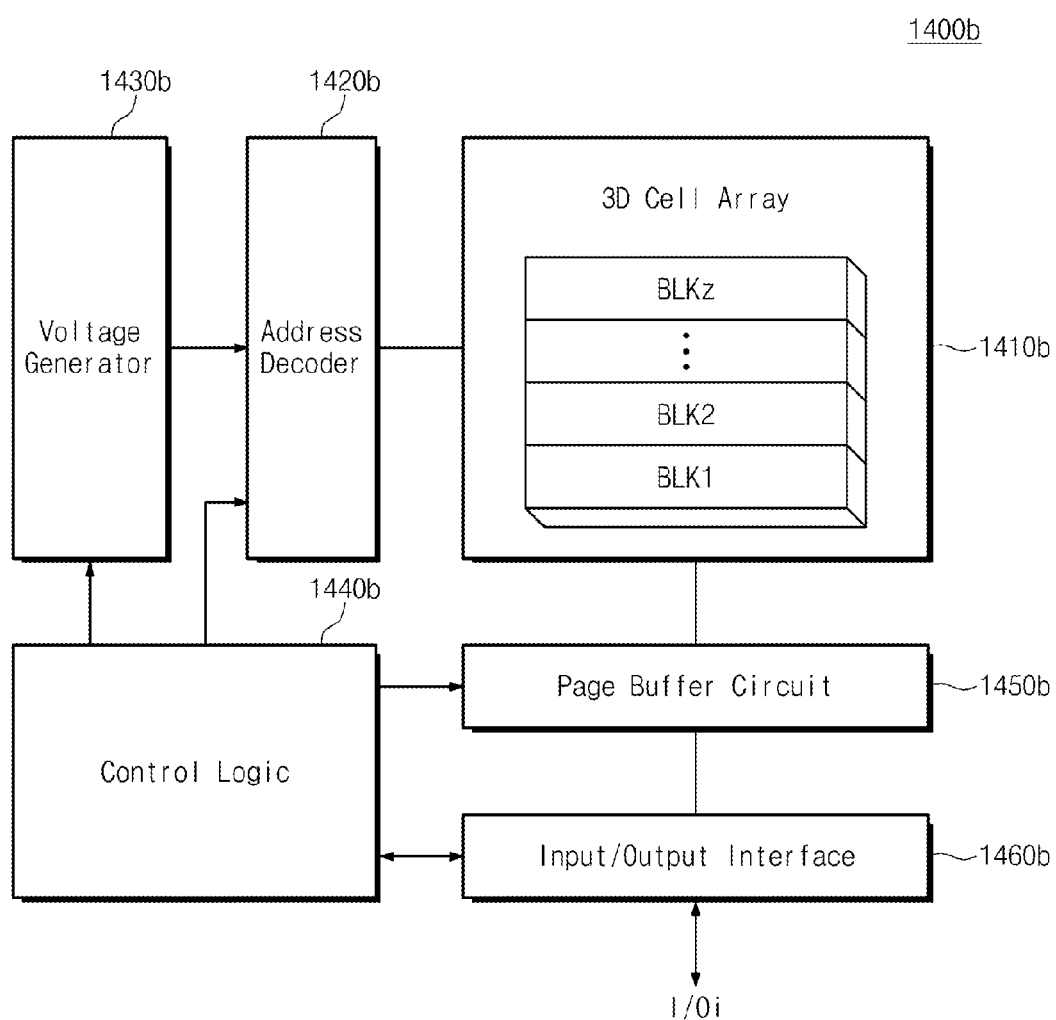
FIG. 15 is a block diagram schematically illustrating a nonvolatile memory device according to still another embodiment of the inventive concept.

FIG. 15 is a block diagram schematically illustrating a nonvolatile memory device according to still another embodiment of the inventive concept.

Referring to FIG. 15, a nonvolatile memory device 1400b may include a memory cell array 1410b, an address decoder 1420b, a voltage generator 1430b, control logic 1440b, a page buffer circuit 1450b, and an input/output interface 1460b. Except for the memory cell array 1410b, the nonvolatile memory device 1400a of FIG. 15 is the same as that of FIG. 5, and thus the description here is focused on the memory cell array 1410b to avoid redundancy.

The memory cell array 1410b may be a three-dimensional memory cell array, and may include a plurality of memory blocks BLK1 to BLKz, each of which is formed to have a three-dimensional structure (or, a vertical structure). In a memory block having a two-dimensional (horizontal) structure, memory cells may be formed in a direction parallel with a substrate surface. In a memory block having a three-dimensional structure, memory cells may be formed in a direction perpendicular to the substrate surface. Each of the memory blocks BLK1 to BLKz may be an erase unit of the nonvolatile memory device 1400b.

Figure 16:
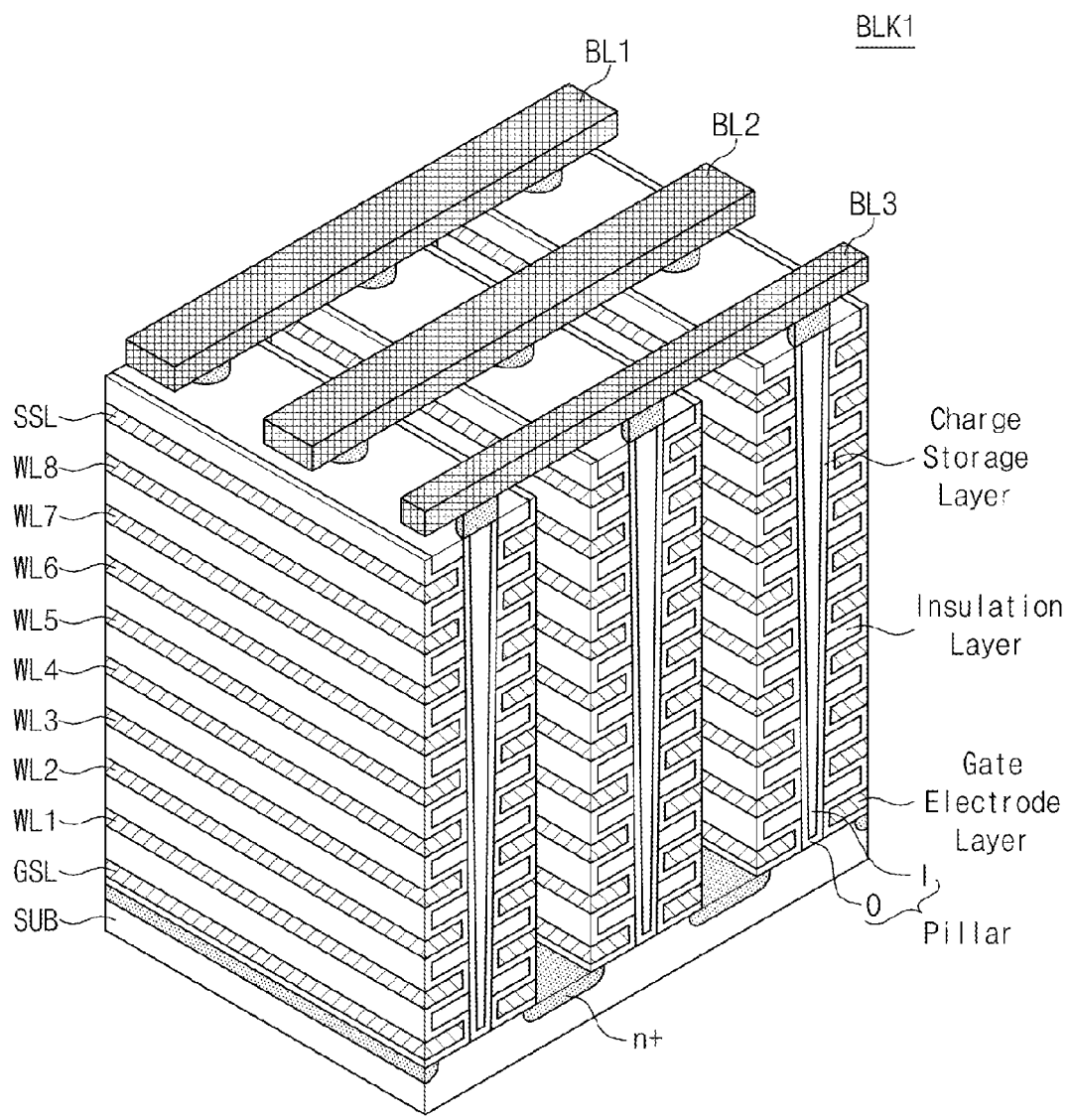
FIG. 16 is a perspective view schematically illustrating an example of a 3D structure of a memory block illustrated in FIG. 15.

FIG. 16 is a perspective view schematically illustrating a 3D structure of a memory block illustrated in FIG. 15. Referring to FIG. 16, a memory block BLK1 may be formed in a direction perpendicular to a substrate SUB. An n+ doping region may be formed at the substrate SUB. A gate electrode layer and an insulation layer may be deposited on the substrate SUB in turn. A charge storage layer may be formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion I thereof may be formed of an insulation material such as silicon oxide.

The gate electrode layer of the memory block BLK1 may be connected with a ground selection line GSL, a plurality of word lines WL1 to WL8, and a string selection line SSL. The pillars of the memory block BLK1 may be connected with a plurality of bit lines BL1 to BL3. In FIG. 16, there is illustrated the case that one memory block BLK1 has two selection lines SSL and GSL, eight word lines WL1 to WL8, and three bit lines BL1 to BL3. However, the inventive concept is not limited thereto.

Figure 17:
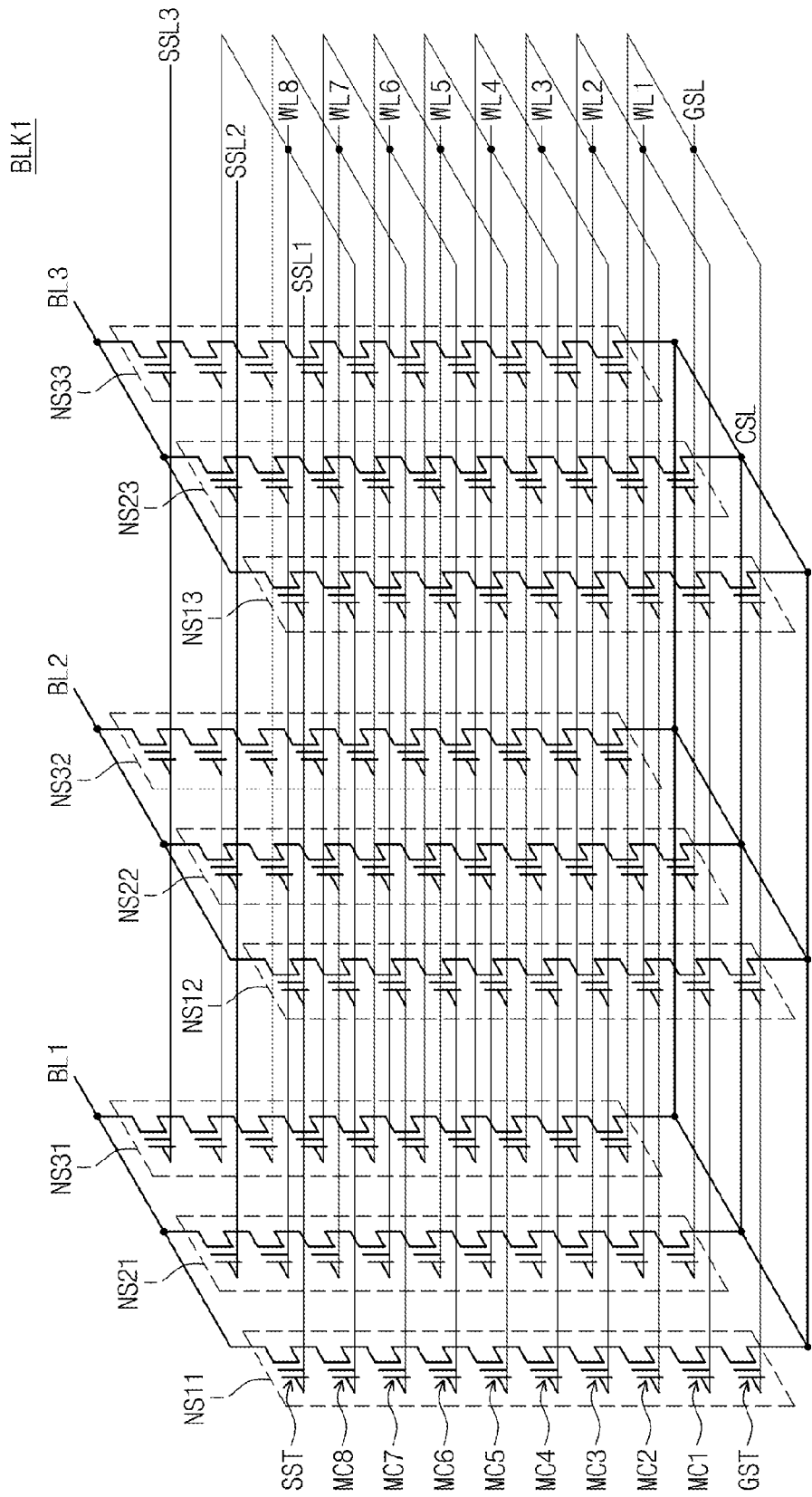
FIG. 17 is an equivalent circuit diagram of a memory block illustrated in FIG. 16.

FIG. 17 is an equivalent circuit of a memory block illustrated in FIG. 16. Referring to FIG. 17, NAND strings NS11 to NS33 may be connected between bit lines BL1 to BL3 and a common source line CSL. Each NAND string (e.g., NS11) may include a string selection transistor SST, a plurality of memory cells MC1 to MC8, and a ground selection transistor GST.

The string selection transistors SST may be connected with string selection lines SSL1 to SSL3. The memory cells MC1 to MC8 may be connected with corresponding word lines WL1 to WL8, respectively. The ground selection transistors GST may be connected with ground selection lines GSL1 to GSL3. In each NAND string, the string selection transistor SST may be connected with a bit line, and the ground selection transistor GST may be connected with the common source line CSL.

Word lines (e.g., WL1) having the same height may be connected in common, and the string selection lines SSL1 to SSL3 may be separated from one another. The string selection lines GSL1 to GSL3 may be connected in common. At programming of memory cells (constituting a page) connected with a first word line WL1 and included in NAND strings NS11, NS12, and NS13, there may be selected a first word line WL1 and a first string selection line SSL1.

Figure 18:
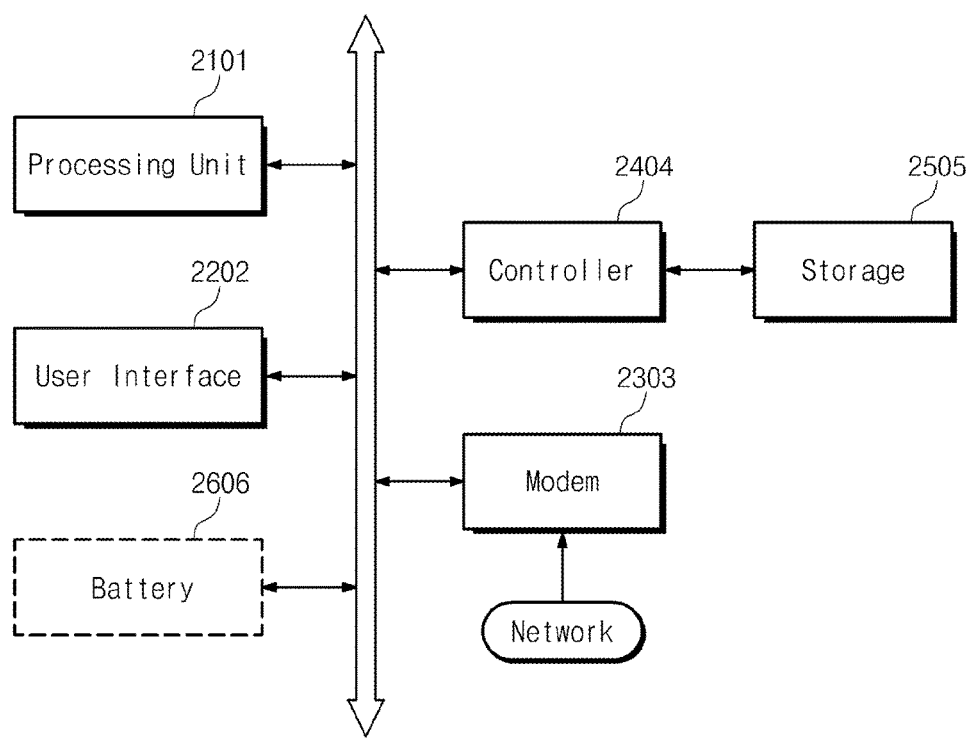
FIG. 18 is a block diagram schematically illustrating a computing system according to an embodiment of the inventive concept.

FIG. 18 is a block diagram schematically illustrating a computing system according to an embodiment of the inventive concept. A computing system may include a processing unit 2101, a user interface 2202, a modem 2303 such as a baseband chipset, a memory controller 2404, and storage medium 2505.

The memory controller 2404 may be configured the same or substantially the same as the controller described in FIG. 3, and the storage medium 2505 may be formed of a nonvolatile memory device which is the same or substantially the same as that illustrated in FIG. 5, 6 or 15. For example, the memory controller 2404 may be configured to manage a program depth map based on a write request of a host. The program depth map may include information indicating whether each of word lines of a nonvolatile memory device is at a lower page program state (e.g., an LSB page program state) or an upper page program state (e.g., an intermediate/MSB page program state in the case of a nonvolatile memory device storing 3-bit data per cell, or a first intermediate/second intermediate/MSB page program state in the case of a nonvolatile memory device storing 4-bit data per cell). The program depth map may be referred at a read request of a host. For example, the program depth map may be used to determine whether a word line corresponding to the read request is at a lower page program state or an upper page program state, and the memory controller 2404 may output a read command, corresponding to the determination result, from among different read commands to the nonvolatile memory device. Herein, the different read commands may include a first command indicating a read operation when a word line is at a lower page program state and a second command indicating a read operation when a word line is at an upper page program state. When the first read command or the second read command is received, the nonvolatile memory device may perform a read operation in the same or substantially the same manner as described with reference to FIG. 9, 12 or 14. In embodiments of the inventive concept, when compared with such a case that flag cells are used, a time tMFC taken to determine whether data read from a flag cell indicates an upper page program state may not be required. Thus, the read performance may be improved.

N-bit data (N being an integer of 1 or more) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 18, the computing system may further comprise an application chipset, a camera image processor (CIS), a mobile DRAM, and the like.

Figure 19:
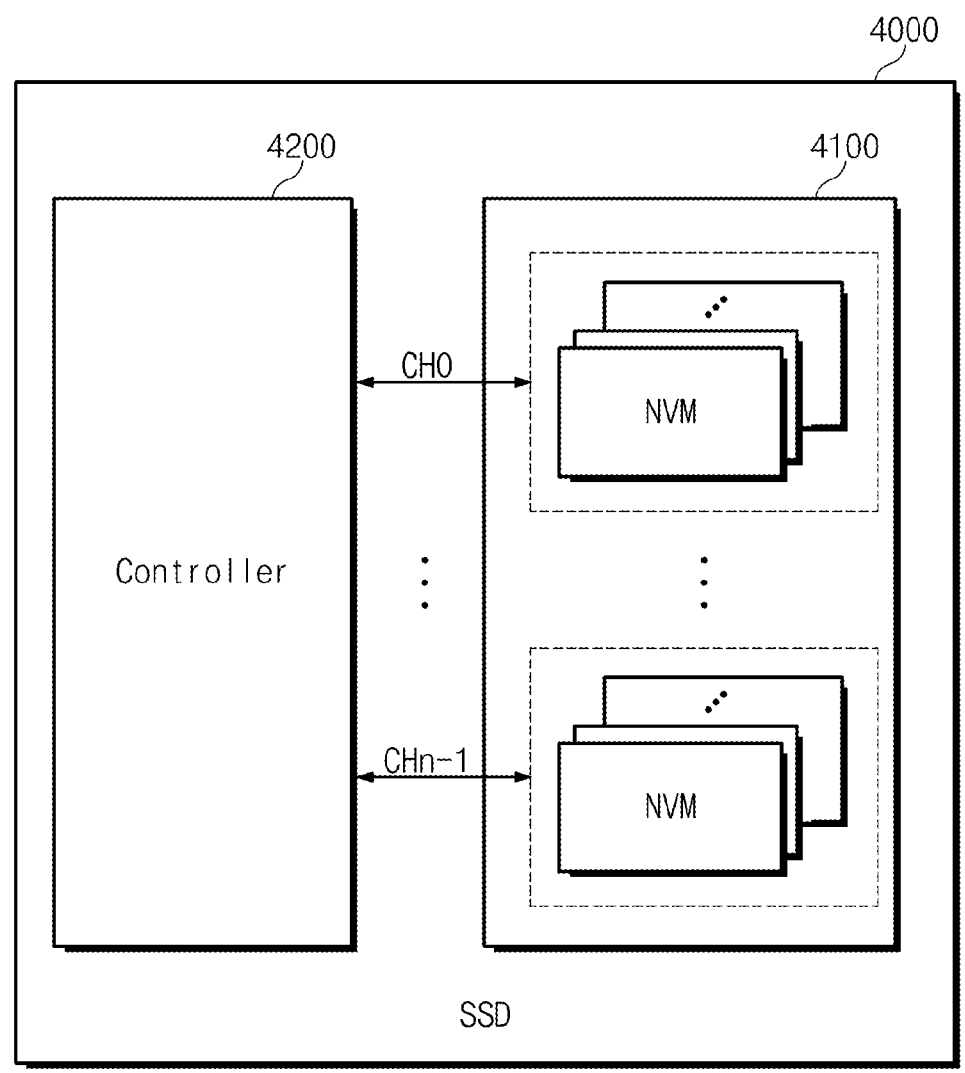
FIG. 19 is a block diagram schematically illustrating a solid state drive according to an embodiment of the inventive concept.

FIG. 19 is a block diagram schematically illustrating a solid state drive according to an embodiment of the inventive concept.

Referring to FIG. 19, a solid state drive (SSD) 4000 may comprise storage medium 4100 and a controller 4200. The storage medium 4100 may be connected with the controller 4200 via a plurality of channels, each of which is connected with a plurality of nonvolatile memories in common.

The controller 4200 may be configured the same or substantially the same as the controller described in connection with FIG. 3, and each of nonvolatile memory devices in storage medium 4100 may be formed of a nonvolatile memory device which is the same or substantially the same as that illustrated in FIG. 5, 6 or 15. For example, the memory controller 4200 may be configured to manage a program depth map based on a write request of a host. The program depth map may include information indicating whether each of word lines of a nonvolatile memory device is at a lower page program state (e.g., an LSB page program state) or an upper page program state (e.g., an intermediate/MSB page program state in the case of a nonvolatile memory device storing 3-bit data per cell, or a first intermediate/second intermediate/MSB page program state in the case of a nonvolatile memory device storing 4-bit data per cell). The program depth map may be referred at a read request of a host. For example, the program depth map may be used to determine whether a word line corresponding to the read request is at a lower page program state or an upper page program state, and the memory controller 4200 may output a read command, corresponding to the determination result, from among different read commands to the nonvolatile memory device. Herein, the different read commands may include a first command indicating a read operation when a word line is at a lower page program state and a second command indicating a read operation when a word line is at an upper page program state. When the first read command or the second read command is received, the nonvolatile memory device may perform a read operation in the same or substantially the same manner as described with reference to FIG. 9, 12 or 14. In embodiments of the inventive concept, when compared with such a case that flag cells are used, a time tMFC taken to determine whether data read from a flag cell indicates an upper page program state may not be required. Thus, the read performance may be improved.

Figure 20:
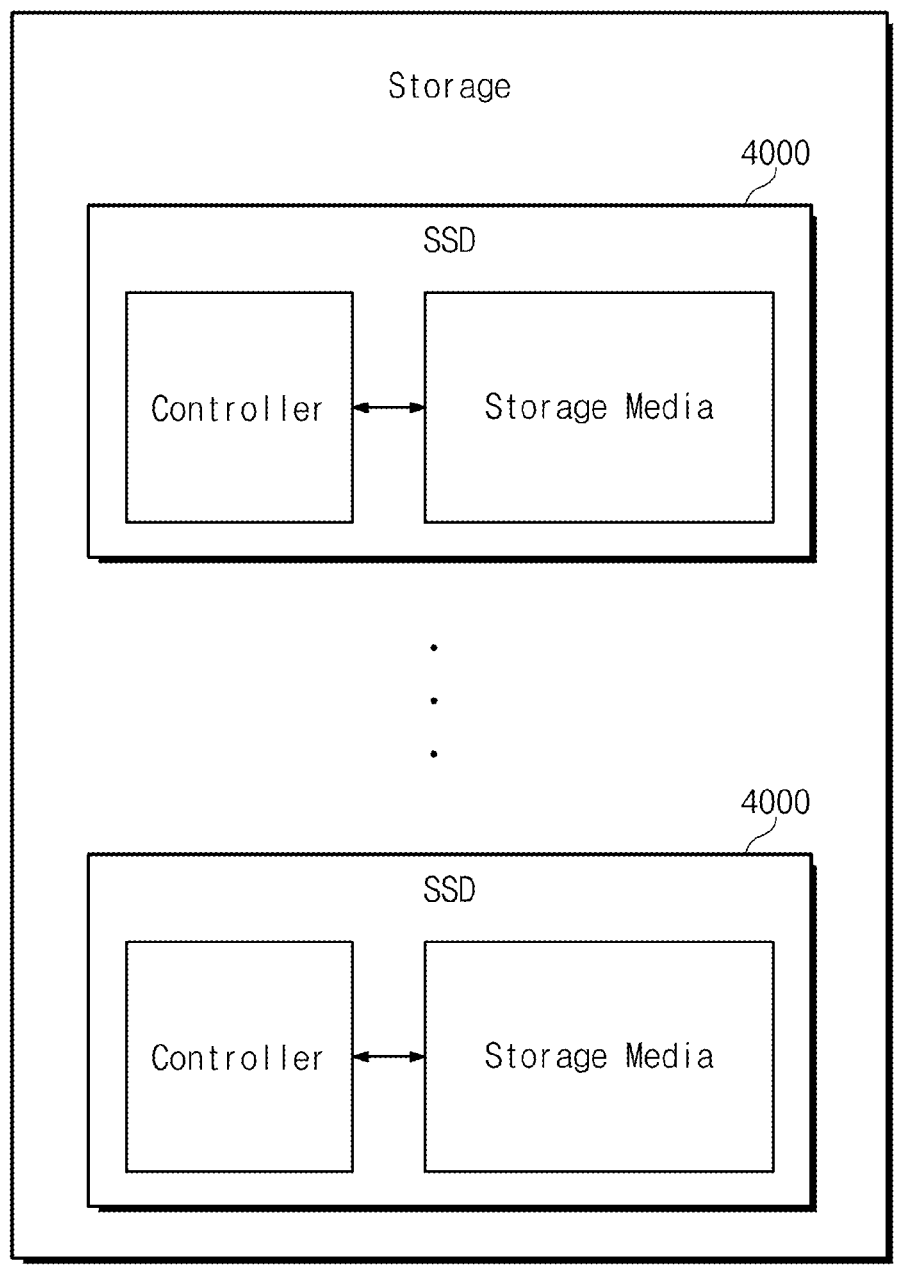
FIG. 20 is a block diagram schematically illustrating an example of a storage using a solid state drive shown in FIG. 19.
Figure 21:
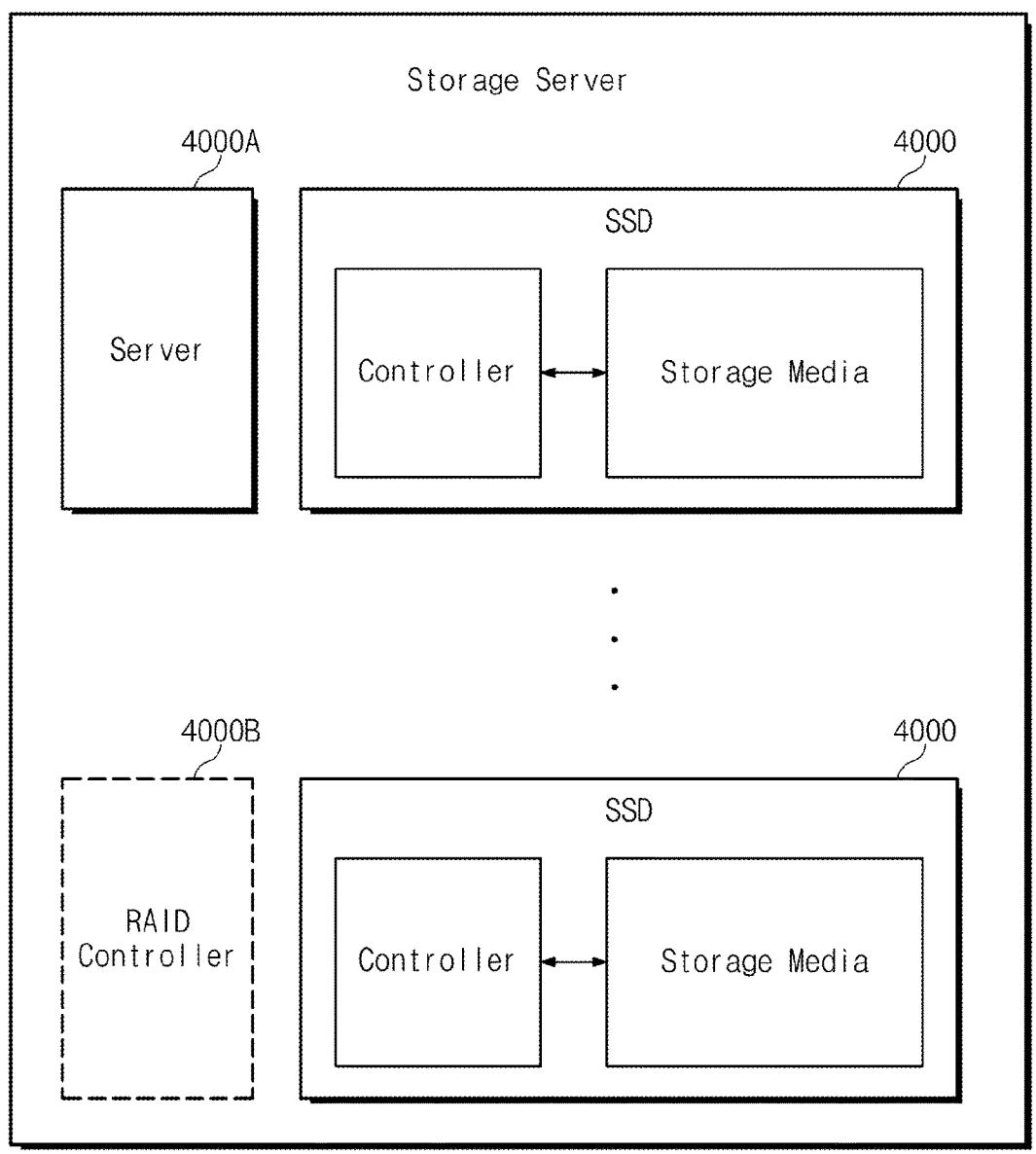
FIG. 21 is a block diagram schematically illustrating an example of a storage server using a solid state drive shown in FIG. 19.

FIG. 20 is a block diagram schematically illustrating a storage using a solid state drive shown in FIG. 19, and FIG. 21 is a block diagram schematically illustrating a storage server using a solid state drive shown in FIG. 19.

An SSD 4000 according to an embodiment of the inventive concept may be used to form the storage. As illustrated in FIG. 20, the storage may include a plurality of solid state drives 4000 which are configured the same or substantially the same as described in connection with FIG. 19. An SSD 4000 according to an embodiment of the inventive concept may be used to configure a storage sever. As illustrated in FIG. 21, a storage server includes a plurality of solid state drives 4000, which are configured the same or substantially the same as the SSD described in connection with FIG. 19, and a server 4000A. Further, a well-known RAID controller 4000B may be provided in the storage server.

Figure 22:
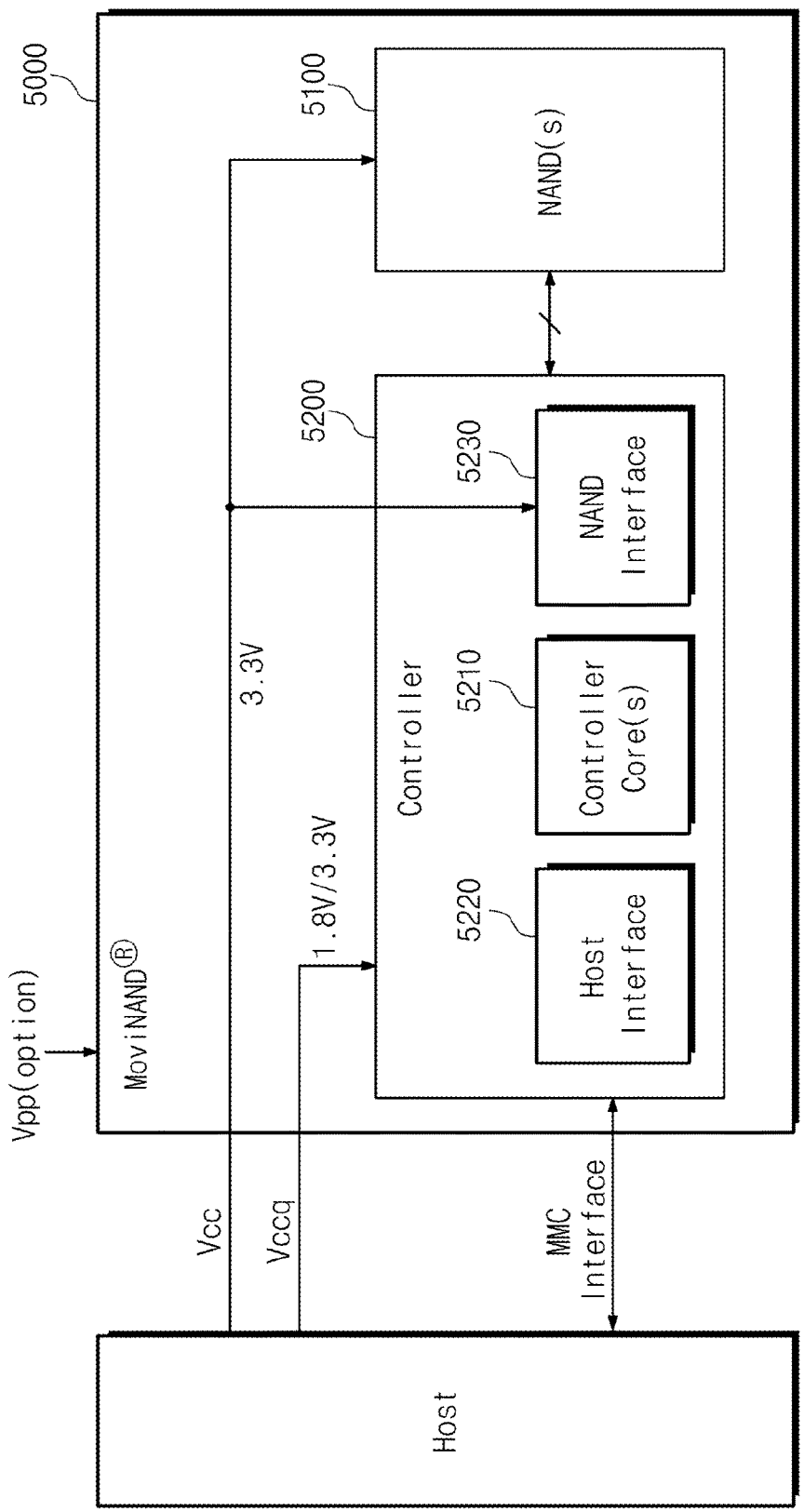
FIG. 22 is a block diagram schematically illustrating an embedded storage according to an embodiment of the inventive concept.

FIG. 22 is a block diagram schematically illustrating embedded storage according to an embodiment of the inventive concept. Referring to FIG. 22, embedded storage 5000 may include at least one NAND flash memory device 5100 and a controller 5200. The embedded storage 5000 (e.g., MoviNAND®) may support the MMC 4.4 (also referred to as "eMMC") standard.

The NAND flash memory device 5100 may be a single data rate (SDR) NAND flash memory device or a double data rate (DDR) NAND flash memory device. In example embodiments, the NAND flash memory device 5100 may include NAND flash memory chips. Herein, the NAND flash memory device 5100 may be implemented by stacking the NAND flash memory chips in one package (e.g., a Fine-pitch Ball Grid Array (FBGA) package, etc.).

The controller 5200 may be configured the same or substantially as the controller described in connection with FIG. 3, and the NAND flash memory device 5100 may be formed of a nonvolatile memory device which is the same or substantially the same as that illustrated in FIG. 5, 6 or 15. For example, the controller 5200 may be configured to manage a program depth map based on a write request of a host. The program depth map may include information indicating whether each of word lines of the NAND flash memory device 5100 is at a lower page program state (e.g., an LSB page program state) or an upper page program state (e.g., an intermediate/MSB page program state in the case of a nonvolatile memory device storing 3-bit data per cell, or a first intermediate/second intermediate/MSB page program state in the case of a nonvolatile memory device storing 4-bit data per cell). The program depth map may be referred at a read request of a host. For example, the program depth map may be used to determine whether a word line corresponding to the read request is at a lower page program state or an upper page program state, and the controller 5200 may output a read command, corresponding to the determination result, from among different read commands to the NAND flash memory device 5100. Herein, the different read commands may include a first command indicating a read operation when a word line is at a lower page program state and a second command indicating a read operation when a word line is at an upper page program state. When the first read command or the second read command is received, the NAND flash memory device 5100 may perform a read operation in the same or substantially the same manner as described with reference to FIG. 9, 12 or 14. In embodiments of the inventive concept, when compared with such a case that flag cells are used, a time tMFC taken to determine whether data read from a flag cell indicates an upper page program state may not be required. Thus, the read performance may be improved.

The controller 5200 may be connected with the NAND flash memory device 5100 via a plurality of channels. The controller 5200 may include at least one controller core 5210, a host interface 5220, and a NAND interface 5230. The controller core 5210 may control an overall operation of the embedded storage 5000. The host interface 5220 may be configured to perform an MMC interface between the controller 5200 and a host. The NAND interface 5230 may be configured to interface between the NAND flash memory device 5100 and the controller 5200. In example embodi-ments, the host interface 5220 may be a parallel interface (e.g., an MMC interface). In other example embodiments, the host interface 5220 of the embedded storage 5000 may be a serial interface (e.g., UHS-II, UFS, etc.).

The embedded storage 5000 may receive power supply voltages Vcc and Vccq from the host. Herein, the power supply voltage Vcc (about 3.3V) may be supplied to the NAND flash memory device 5100 and the NAND interface 5230, while the power supply voltage Vccq (about 1.8V/3.3V) may be supplied to the controller 5200. In example embodiments, an external high voltage Vpp may be optionally supplied to the embedded storage 5000.

The embedded storage 5000 according to an embodiment of the inventive concept may be advantageous to store mass data and realize an improved read characteristic. The embedded storage 5000 according to an embodiment of the inventive concept is applicable to small and low-power mobile products (e.g., a Galaxy S®, iPhone®, etc.).

Figure 23:
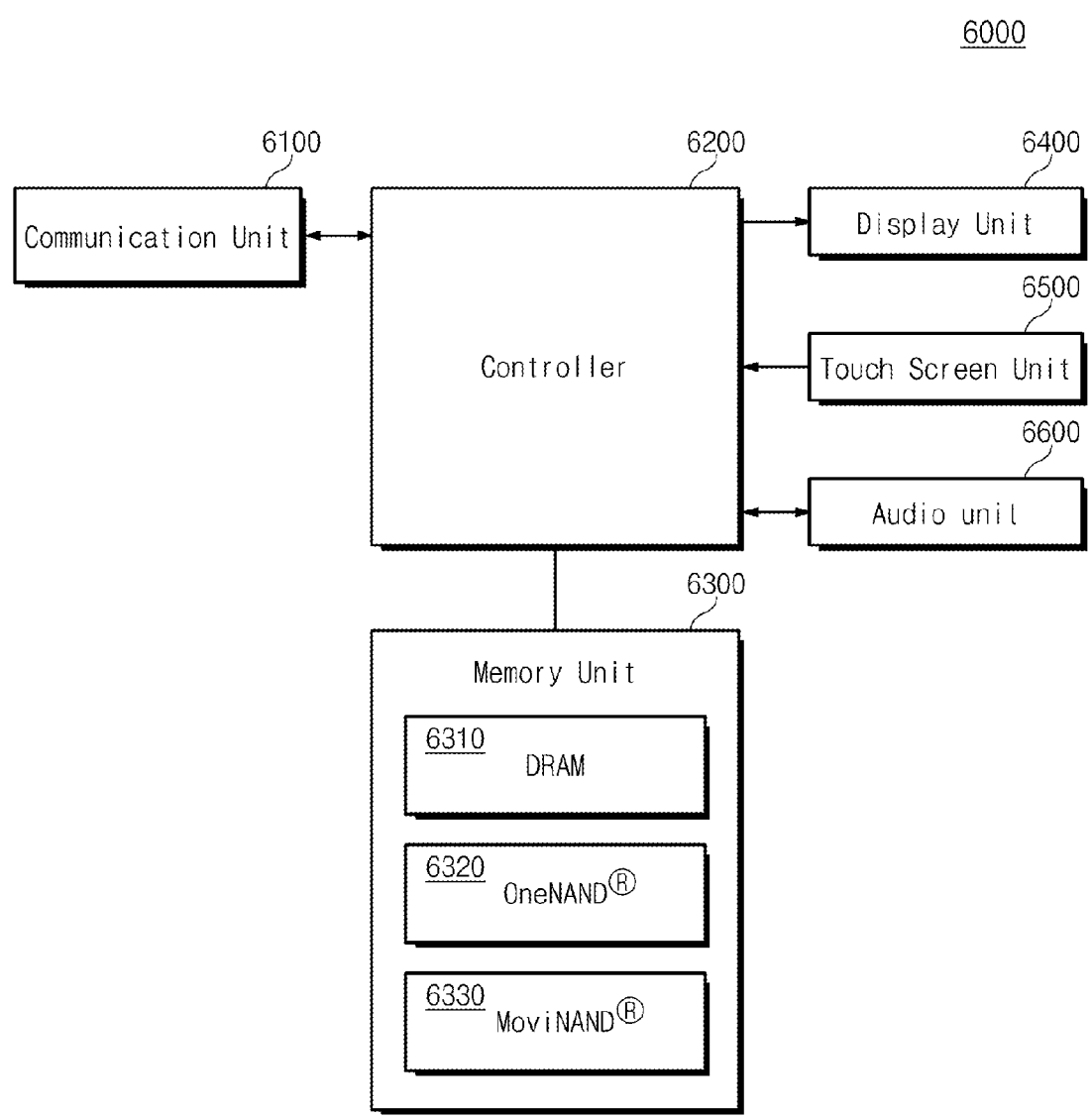
FIG. 23 is a block diagram schematically illustrating a communication device according to an embodiment of the inventive concept.

FIG. 23 is a block diagram schematically illustrating a communication device according to an embodiment of the inventive concept. Referring to FIG. 23, a communication device 6000 may include a communication unit 6100, a controller 6200, a memory unit 6300, a display unit 6400, a touch screen unit 6500, and an audio unit 6600. The memory unit 6300 may include at least one DRAM 6310, at least one OneNAND® 6320, and at least one MoviNAND® (or, embedded storage) 6330.

A detailed description of a mobile device is disclosed in U.S. Patent Publication Nos. 2010/0062715, 2010/0309237 and 2010/0315325, the entire contents of which are here incorporated by references.

Figure 24:
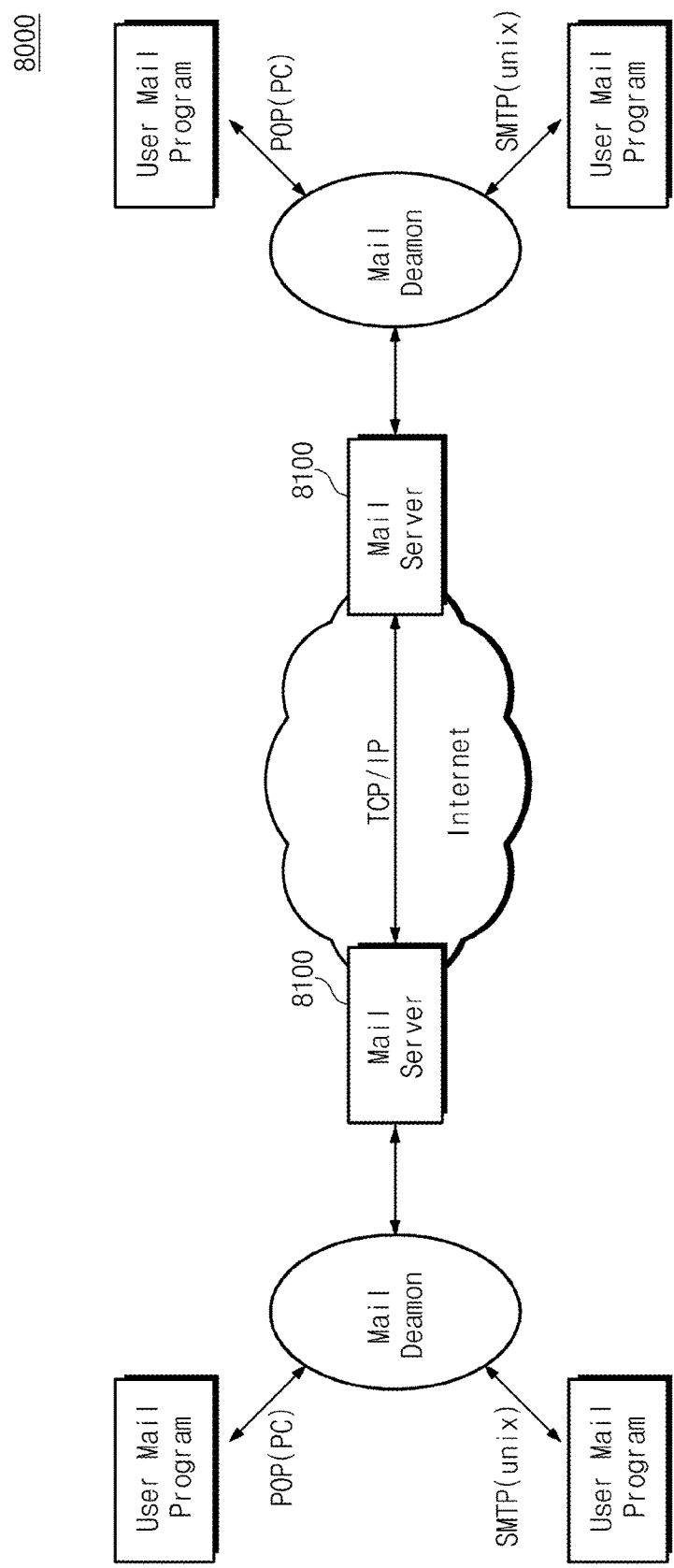
FIG. 24 is a diagram schematically illustrating a system to which a solid state drive device according to an embodiment of the inventive concept is applied.

FIG. 24 is a diagram schematically illustrating a system to which a solid state drive device according to an embodiment of the inventive concept is applied.

As illustrated in FIG. 24, a solid state drive including a data storage device according to an embodiment of the inventive concept may be applied to a main server 8100.

Figure 25:
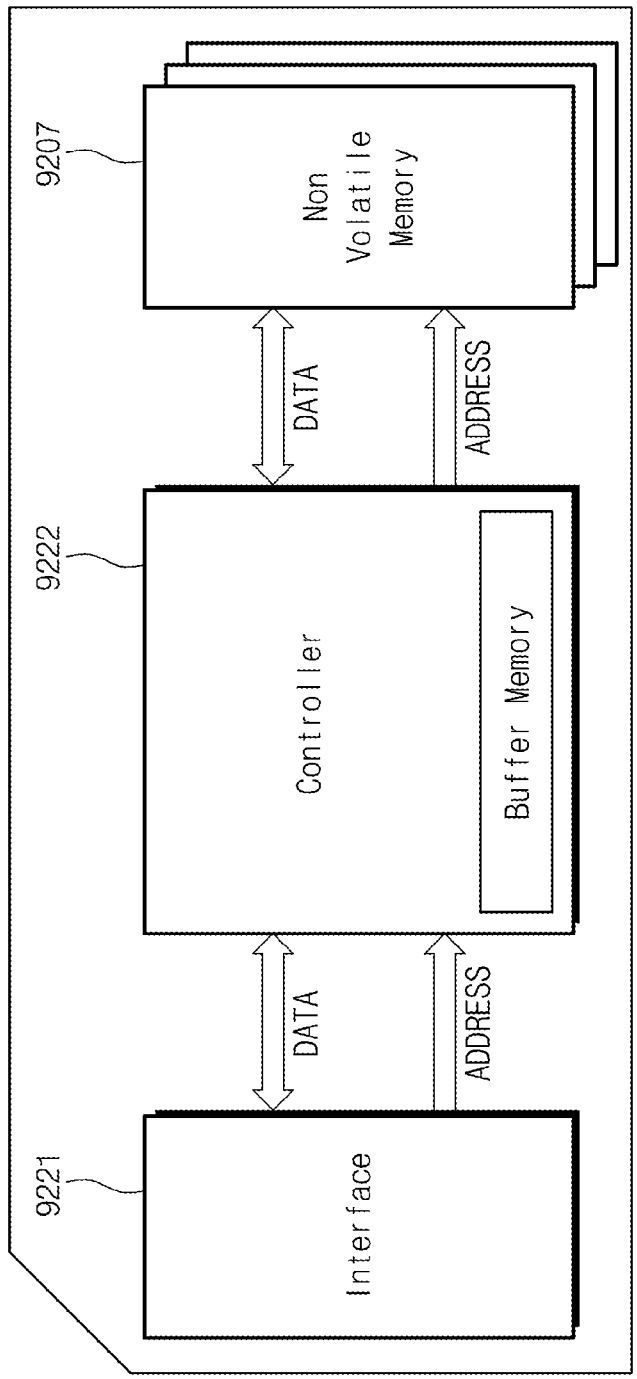
FIG. 25 is a block diagram schematically illustrating a memory card according to an embodiment of the inventive concept.

FIG. 25 is a block diagram schematically illustrating a memory card according to an embodiment of the inventive concept.

A memory card of FIG. 25 may, as examples, be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 25, the memory card may include an interface circuit 9221 for interfacing with an external device, a controller 9222 including a buffer memory and controlling an operation of the memory card, and at least one nonvolatile memory device 9207. The controller 9222 may be a processor which is configured to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (e.g., SD/MMC) for data exchange between a host and a memory card.

The controller 9222 may be configured the same or substantially the same as the controller described in connection with FIG. 3, and the nonvolatile memory device 9207 may be formed of a nonvolatile memory device which is the same or substantially the same as that illustrated in FIG. 5, 6 or 15. For example, the controller 9222 may be configured to manage a program depth map based on a write request of a host. The program depth map may include information indicating whether each of word lines of the nonvolatile memory device 9207 is at a lower page program state (e.g., an LSB page program state) or an upper page program state (e.g., an intermediate/MSB page program state in the case of a nonvolatile memory device storing 3-bit data per cell, or a first intermediate/second intermediate/MSB page program state in the case of a nonvolatile memory device storing 4-bit data per cell). The program depth map may be referred at a read request of a host. For example, the program depth map may be used to determine whether a word line corresponding to the read request is at a lower page program state or an upper page program state, and the controller 9222 may output a read command, corresponding to the determination result, from among different read commands to the nonvolatile memory device 9207. Herein, the different read commands may include a first command indicating a read operation when a word line is at a lower page program state and a second command indicating a read operation when a word line is at an upper page program state. When the first read command or the second read command is received, the nonvolatile memory device 9207 may perform a read operation in the same or substantially the same manner as described with reference to FIG. 9, 12 or 14. In embodiments of the inventive concept, when compared with such a case that flag cells are used, a time tMFC taken to determine whether data read from a flag cell indicates an upper page program state may not be required. Thus, the read performance may be improved.

Figure 26:
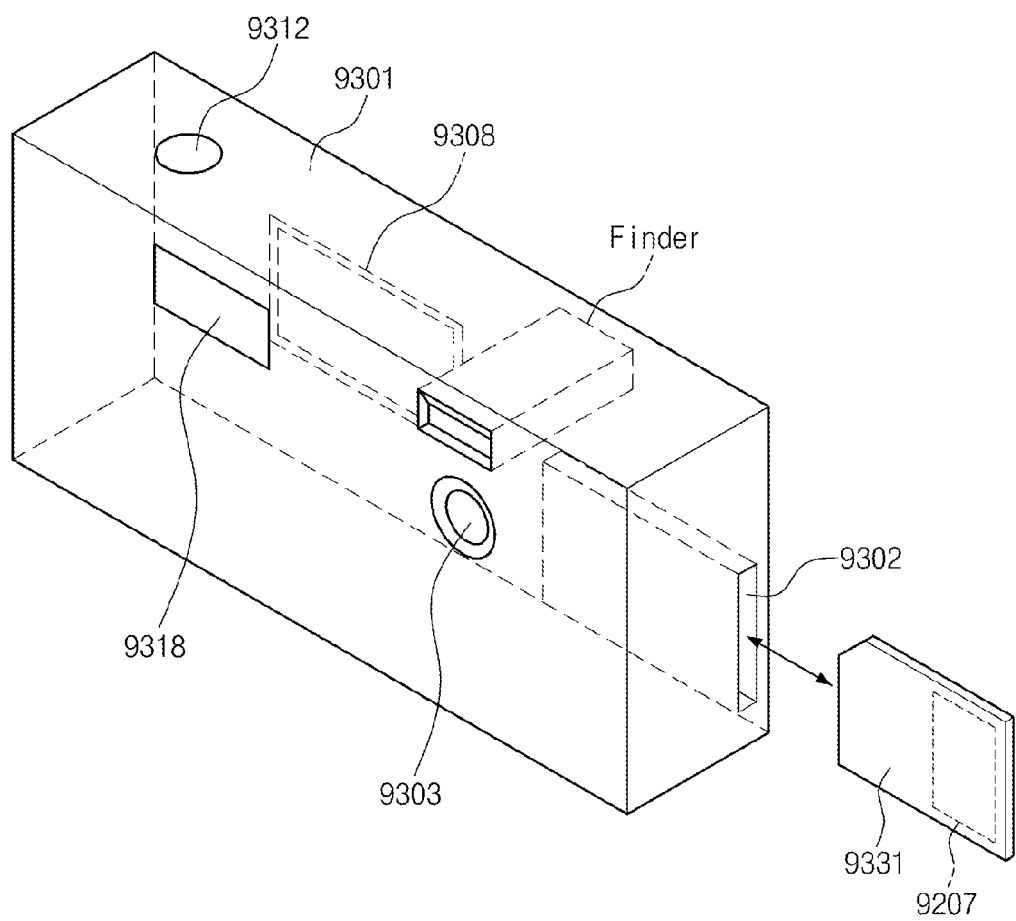
FIG. 26 is a block diagram schematically illustrating a digital still camera according to an embodiment of the inventive concept.

FIG. 26 is a block diagram schematically illustrating a digital still camera according to an embodiment of the inventive concept.

Referring to FIG. 26, a digital still camera may include a body 9301, a slot 9302, a lens 9303, a display unit 9308, a shutter button 9312, a strobe 9318, and the like. A memory card 9331 may be inserted in the slot 9302, and the memory card 9331 may include a memory controller and a nonvolatile memory device described in connection with FIG. 2.

The memory controller may be configured the same or substantially the same as the controller described in connection with FIG. 3, and the nonvolatile memory device may be formed of a nonvolatile memory device which is the same or substantially the same as that illustrated in FIG. 5, 6 or 15. For example, the memory controller may be configured to manage a program depth map based on a write request of a host. The program depth map may include information indicating whether each of word lines of the nonvolatile memory device is at a lower page program state (e.g., an LSB page program state) or an upper page program state (e.g., an intermediate/MSB page program state in the case of a nonvolatile memory device storing 3-bit data per cell, or a first intermediate/second intermediate/MSB page program state in the case of a nonvolatile memory device storing 4-bit data per cell). The program depth map may be referred at a read request of a host. For example, the program depth map may be used to determine whether a word line corresponding to the read request is at a lower page program state or an upper page program state, and the memory controller may output a read command, corresponding to the determination result, from among different read commands to the nonvolatile memory device. Herein, the different read commands may include a first command indicating a read operation when a word line is at a lower page program state and a second command indicating a read operation when a word line is at an upper page program state. When the first read command or the second read command is received, the nonvolatile memory device 9207 may perform a read operation in the same or substantially the same manner as described with reference to FIG. 9, 12 or 14. In embodiments of the inventive concept, when compared with such a case that flag cells are used, a time tMFC taken to determine whether data read from a flag cell indicates an upper page program state may not be required. Thus, the read performance may be improved.

In the case where the memory card 9331 is a contact type, an electric circuit on a circuit board may be electrically contacted with the memory card 9331 when it is inserted in the slot 9302. In the case where the memory card 9331 has a non-contact type, the memory card 9331 may be accessed in a wireless manner such as by radio-frequency (RF) waves.

Figure 27:
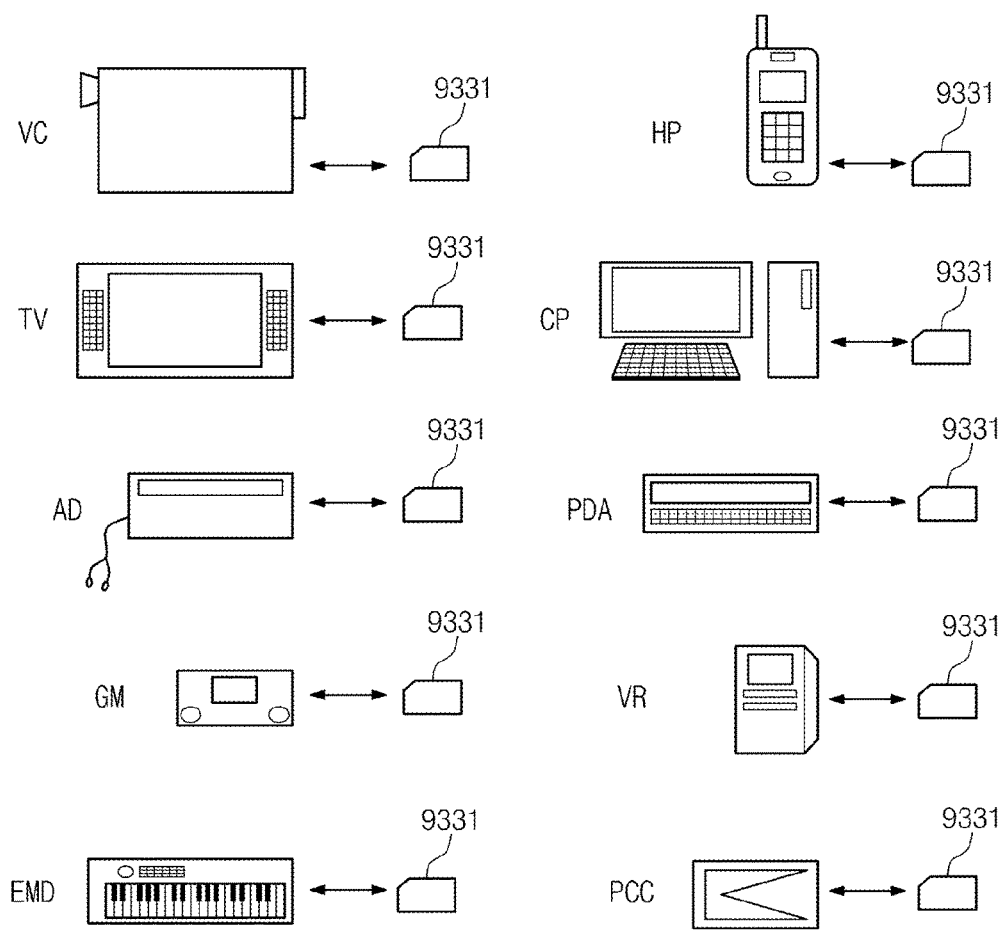
FIG. 27 is a diagram schematically illustrating various systems to which a memory card shown in FIG. 25 is applied.

FIG. 27 is a diagram schematically illustrating various systems to which a memory card in shown FIG. 25 is applied.

Referring to FIG. 27, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In an example embodiment, memory cells can be formed of a variable resistance memory cell. An exemplary variable resistance memory cell and a memory device including the same are disclosed in U.S. Pat. No. 7,529,124, the entirety of which is incorporated by reference herein.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In still other example embodiments, a memory device having a charge trap flash structure as a charge storage layer is disclosed in U.S. Pat. No. 6,858,906 and U.S. Patent Publication Nos. 2004/0169238 and 2006/0180851, the entireties of which are incorporated by reference herein. A source-drain free flash structure is disclosed in KR Patent No. 673020, the entirety of which is incorporated by reference herein.

A non-volatile memory device and/or a memory controller according to the inventive concept may be packaged according to any of a variety of different packaging technologies. Examples of such packaging technologies include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An operating method of a memory device which controls a nonvolatile memory, the operating method comprising:

managing a program depth bit map indicating an upper page program state of each of a plurality of word lines of the nonvolatile memory in response to an external write request, by a memory controller, where the program depth bit map is stored in a buffer memory in the memory controller which is separate from the nonvolatile memory; and outputting one of a plurality of different read commands to the nonvolatile memory based on information of the program depth bit map corresponding to a word line to be accessed in response to an external read request, wherein the plurality of different read commands comprises a first read command directing a read operation on a word line only having a lower page program state, and a second read command directing a read operation on a word line having an upper page program state, wherein a read time corresponding to a lower page read operation of the nonvolatile memory executed according to the first read command is the same as a read time corresponding to a lower page read operation of the nonvolatile memory executed according to the second read command, and wherein a read operation of the nonvolatile memory executed according to each of the first and second read commands does not include an operation of determining an upper page program state of the word line to be accessed.

2. The operating method of claim 1, wherein at least 2-page data is stored at memory cells of each word line.

3. A memory system, comprising:
at least one nonvolatile memory; and
a memory controller configured to control the at least one nonvolatile memory, the memory controller including a buffer memory separate from the nonvolatile memory, the buffer memory being configured to store therein a program depth bit map indicating an upper page program state of each of a plurality of word lines of the at least one nonvolatile memory, wherein the memory controller is responsive to an external read request to provide the at least one nonvolatile memory with one of a plurality of different read commands based on bit information, corresponding to a word line to be accessed, of the program depth bit map, and wherein the at least one nonvolatile memory includes flag cells for storing program states of the word lines, and wherein the flag cells are accessed to form the program depth bit map before the at least one nonvolatile memory is provided with the one of the plurality of different read commands.

4. The memory system of claim 3, wherein the memory controller is responsive to an external write request to manage the program depth bit map in accordance with the external write request.

5. The memory system of claim 4, wherein the plurality of read commands comprises a first read command directing a read operation on a word line only having a lower page program state, and a second read command directing a read operation on a word line having an upper page program state.

6. The memory system of claim 5, wherein when the first read command is received, the at least one nonvolatile memory performs a read operation on lower page data of the word line to be accessed.

7. The memory system of claim 6, wherein when the second read command is received, the at least one nonvolatile memory performs a read operation on one of lower page data and upper page data of the word line to be accessed based on a page address input together with the second read command.

8. The memory system of claim 7, wherein a read time corresponding to lower page data of the nonvolatile memory executed according to the first read command is the same as a read time corresponding to lower page data of the nonvolatile memory executed according to the second read command.

9. The memory system of claim 3, wherein the at least one nonvolatile memory does not include flag cells for storing program states of the word lines.

10. The memory system of claim 3, wherein the at least one nonvolatile memory includes memory cells each storing low page data and upper page data.

11. The memory system of claim 5, wherein a read operation of the nonvolatile memory executed according to each of the first and second read commands does not include an operation of determining an upper page program state of the word line to be accessed.

12. A memory controller comprising:
a host interface configured to interface with a host device;
a memory interface configured to interface with a nonvolatile memory which includes a plurality of word lines;
a processor configured to transmit commands to the memory interface in accordance with requests received from the host interface; and
a memory configured to store therein a program depth bit map indicating an upper bit program state of each of the plurality of word lines of the nonvolatile memory, wherein the processor is responsive to a read request received via the host interface to access the memory to determine the upper bit program state of a word line to be accessed among the plurality of word lines, and to transmit one of plural different read commands to the memory interface in accordance with the determined upper bit program state of the word line to be accessed, wherein the nonvolatile memory includes flag cells for storing program states of the word lines, and wherein the memory controller is further configured to access the flag cells to form the program depth bit map before transmitting the one of the plural different read commands to the memory interface in accordance with the determined upper bit program state of the word line to be accessed.

13. The memory controller of claim 12, wherein the processor is configured to update the bit map in response to a write request received via the host interface.

14. The method of claim 1, wherein the at least one nonvolatile memory includes flag cells for storing program states of the word lines, the method further comprising accessing the flag cells to form the program depth bit map before outputting the one of the plurality of different read commands to the nonvolatile memory based on the information of the program depth bit map.

* * * * *